(12) United States Patent
Tsurumi

(10) Patent No.: US 9,602,070 B2
(45) Date of Patent: Mar. 21, 2017

(54) POWER AMPLIFYING DEVICE

(71) Applicant: Kabushiki Kaisha Toshiba, Minato-Ku, Tokyo (JP)

(72) Inventor: Hiroyuki Tsurumi, Fujisawa Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/848,033

(22) Filed: Sep. 8, 2015

(65) Prior Publication Data

US 2016/0276993 A1    Sep. 22, 2016

(30) Foreign Application Priority Data

Mar. 16, 2015 (JP) ................ 2015-052022

(51) Int. Cl.
| | |
|---|---|
| *H03F 3/217* | (2006.01) |
| *H03G 3/30* | (2006.01) |
| *H03F 3/185* | (2006.01) |
| *H03F 3/45* | (2006.01) |
| *H03F 3/68* | (2006.01) |
| *H03F 3/21* | (2006.01) |

(52) U.S. Cl.
CPC .......... *H03G 3/3031* (2013.01); *H03F 3/185* (2013.01); *H03F 3/211* (2013.01); *H03F 3/45179* (2013.01); *H03F 3/68* (2013.01); *H03F 3/217* (2013.01); *H03F 3/2173* (2013.01); *H03F 2200/03* (2013.01); *H03F 2200/135* (2013.01)

(58) Field of Classification Search
CPC ....... H03G 3/3031; H03F 3/185; H03F 3/211; H03F 3/45179; H03F 3/68; H03F 3/217; H03F 2200/432; H03F 3/2173; H03F 3/2171; H03F 3/72; H03F 1/0277; H03F 2200/261; H03F 2203/45138; H03F 3/45
USPC .................................. 330/51, 69, 146, 251
See application file for complete search history.

(56) References Cited

U.S. PATENT DOCUMENTS

| | | | |
|---|---|---|---|
| 5,365,188 | A | 11/1994 | Botti et al. |
| 5,444,417 | A | 8/1995 | Botti et al. |
| 5,621,352 | A | 4/1997 | Botti et al. |
| 5,654,668 | A | 8/1997 | Botti et al. |
| 6,107,886 | A | 8/2000 | Kusakabe et al. |
| 7,113,031 | B2 | 9/2006 | Rabary et al. |
| 7,113,032 | B2 | 9/2006 | Botti et al. |
| 7,167,047 | B2 | 1/2007 | Botti et al. |
| 7,230,482 | B2 | 6/2007 | Chelli et al. |
| 7,557,660 | B2 | 7/2009 | Tsurumi |
| 7,813,515 | B2 | 10/2010 | Botti et al. |
| 8,330,539 | B2 | 12/2012 | Hissink et al. |
| 8,552,799 | B2 | 10/2013 | Tsurumi |

(Continued)

*Primary Examiner* — Khanh V Nguyen
(74) *Attorney, Agent, or Firm* — White & Case LLP

(57) ABSTRACT

The power amplifying device includes a first potential line to which a first potential is supplied, a second potential line to which a second potential that is lower than the first potential is supplied and a third potential line to which a third potential that is between the first potential and the second potential is supplied. The power amplifying device includes a first BTL amplifier unit. The power amplifying device includes a second BTL amplifier unit. The power amplifying device includes a third BTL amplifier unit. The power amplifying device includes a fourth BTL amplifier unit that has a seventh output amplifier and an eighth output amplifier.

16 Claims, 26 Drawing Sheets

(56) References Cited

U.S. PATENT DOCUMENTS

| | | | |
|---|---|---|---|
| 8,933,753 B2* | 1/2015 | Nussbaum | H03F 3/2178 |
| | | | 330/251 |
| 2011/0123040 A1* | 5/2011 | Hissink | H03F 1/0277 |
| | | | 381/86 |
| 2013/0038395 A1 | 2/2013 | Tsurumi | |

* cited by examiner

POWER AMPLIFYING DEVICE

CROSS-REFERENCE TO RELATED APPLICATION

This application is based upon and claims the benefit of priority from the prior Japanese Patent Application No. 2015-052022, filed on Mar. 16, 2015, the entire contents of which are incorporated herein by reference.

BACKGROUND

Field

Embodiments described herein relate generally to a power amplifying device.

Background Art

Power amplifying devices for car audio equipment typically have a B-class or AB-class bridge circuit configuration and are installed in a limited space. The car audio equipment has problems in that it is difficult to install a large heat radiating device, such as a radiator fin, and semiconductor devices of the audio equipment are damaged by heat and have a reduced life time.

Recent car audio equipment tends to have higher power and more channels and to be multimedia-ready. In this trend, there is an increasing demand for a high-efficiency power amplifier system that generates less heat.

One of common on-vehicle power amplifying devices having a single power supply rail is a power amplifying device of a multi-stage vertical configuration.

With the multi-stage vertical configuration, however, the single power supply rail needs to be divided into multiple stages to produce a bias voltage, and each of the bridge amplifiers vertically stacked needs to be driven within the range of the bias voltage.

Therefore, if the power supply voltage is low, the voltage applied to the bridge amplifier is also low, and it is difficult to achieve bridge amplification.

Thus, the conventional power amplifying devices have a problem in that it is difficult to further reduce the consumed current.

DETAILED DESCRIPTION

Figure 1:
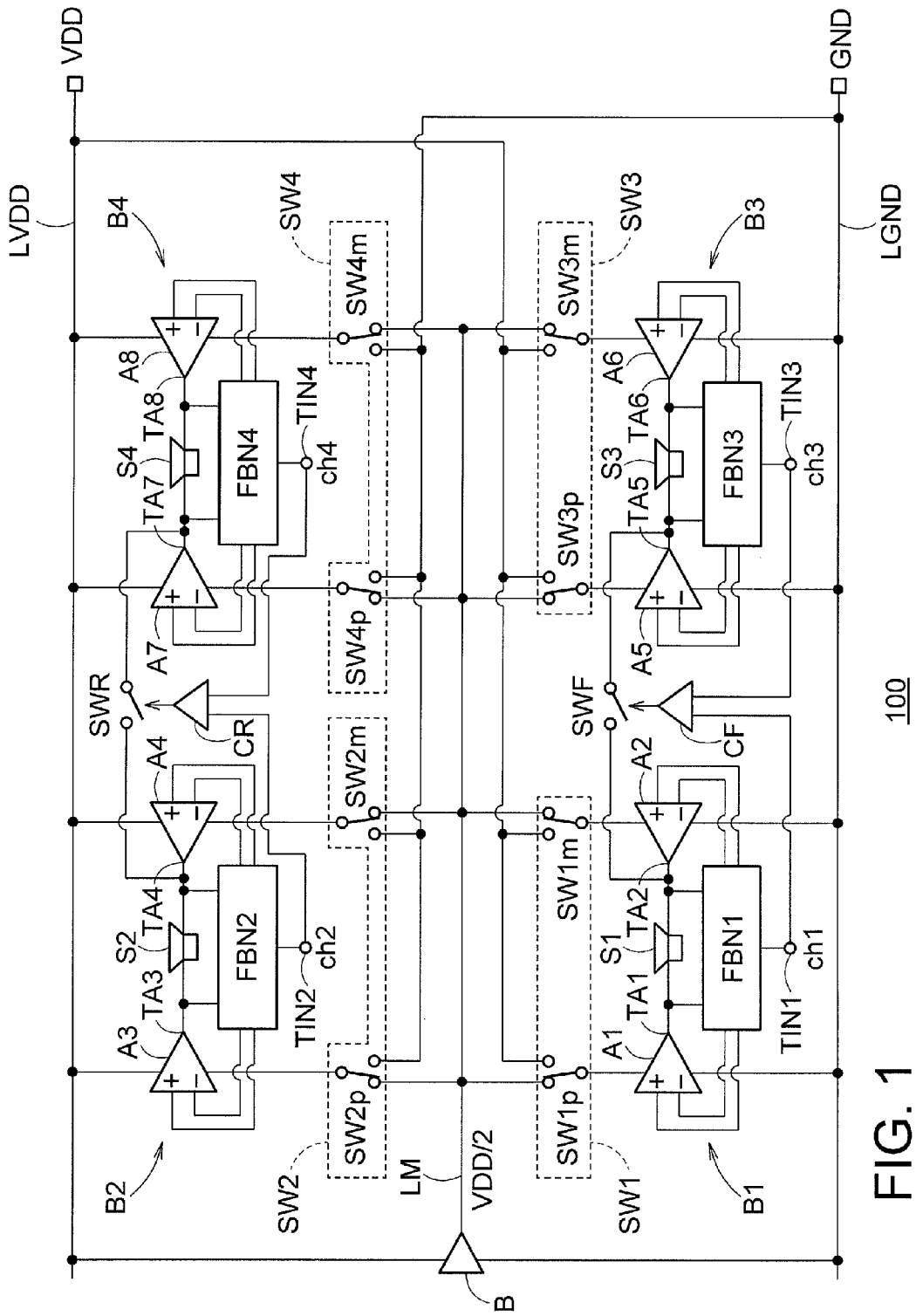
FIG. 1 is a diagram showing an example of a configuration of an audio system including a power amplifying device 100 according to a first embodiment.

A power amplifying device according to an embodiment includes a first potential line to which a first potential is supplied. The power amplifying device includes a second potential line to which a second potential that is lower than the first potential is supplied. The power amplifying device includes a third potential line to which a third potential that is between the first potential and the second potential is supplied. The power amplifying device includes a first BTL amplifier unit that has a first output amplifier and a second output amplifier that are bridge-connected and outputs a first output signal obtained by amplifying a first input signal. The power amplifying device includes a second BTL amplifier unit that has a third output amplifier and a fourth output amplifier that are bridge-connected and outputs a second output signal obtained by amplifying a second input signal. The power amplifying device includes a third BTL amplifier unit that has a fifth output amplifier and a sixth output amplifier that are bridge-connected and outputs a third output signal obtained by amplifying a third input signal. The power amplifying device includes a fourth BTL amplifier unit that has a seventh output amplifier and an eighth output amplifier that are bridge-connected and outputs a fourth output signal obtained by amplifying a fourth input signal. The power amplifying device includes a first connecting circuit that connects the first and second output amplifiers between the second potential line and the third potential line or between the second potential line and the first potential line in response to the first output signal. The power amplifying device includes a second connecting circuit that connects the third and fourth output amplifiers between the first potential line and the third potential line or between the first potential line and the second potential line in response to the second output signal. The power amplifying device includes a third connecting circuit that connects the fifth and sixth output amplifiers between the second potential line and the third potential line or between the second potential line and the first potential line in response to the third output signal. The power amplifying device includes a fourth connecting circuit that connects the seventh and eighth output amplifiers between the first potential line and the third potential line or between the first potential line and the second potential line in response to the fourth output signal. The power amplifying device includes a low potential-side switching circuit that is turned on to establish a connection between an output of the second output amplifier and an output of the fifth output amplifier or is turned off to break the connection between the output of the second output amplifier and the output of the fifth output amplifier in response to the first and third input signals. The power amplifying device includes a high potential-side switching circuit that is turned on to establish a connection between an output of the fourth output amplifier and an output of the seventh output amplifier or is turned off to break the connection between the output of the fourth output amplifier and the output of the seventh output amplifier in response to the second and fourth input signals. The power amplifying device includes a first controlling circuit that controls outputs of the first and second output amplifiers in response to the first input signal. The power amplifying device includes a second controlling circuit that controls outputs of the third and fourth output amplifiers in response to the second input signal. The power amplifying device includes a third controlling circuit that controls outputs of the fifth and sixth output amplifiers in response to the third input signal. The power amplifying device includes a fourth controlling circuit that controls outputs of the seventh and eighth output amplifiers in response to the fourth input signal.

In the following, an embodiment will be described with reference to the drawings.

First Embodiment

FIG. 1 is a diagram showing an example of a configuration of an audio system including a power amplifying device 100 according to a first embodiment.

As shown in FIG. 1, the power amplifying device 100 includes a first potential line "LVDD", a second potential line "LGND", a third potential line "LM", a potential generating circuit "B", a first BTL amplifier unit "B1", a second BTL amplifier unit "B2", a third BTL amplifier unit "B3", a fourth BTL amplifier unit "B4", a first connecting circuit "SW1", a second connecting circuit "SW2", a third connecting circuit "SW3", a fourth connecting circuit "SW4", a low potential-side switching circuit "SWF", a high potential-side switching circuit "SWR", a first controlling circuit "FBN1", a second controlling circuit "FBN2", a third controlling circuit "FBN3", a fourth controlling circuit "FBN4", a first comparator "CF", and a second comparator "CR".

A first potential (a power supply voltage) "VDD" is supplied to the first potential line "LVDD". A second potential (a ground voltage) "GND" that is lower than the first potential "VDD" is supplied to the second potential line "LGND". A third potential "VDD/2" is supplied to the third potential line "LM".

The potential generating circuit "B" generates the third potential "VDD/2", which is between the first potential "VDD" and the second potential "GND". The third potential "VDD/2" is at the midpoint between the first potential "VDD" and the second potential "GND", for example. Any third potential between the first potential and the second potential is possible, and the third potential does not always need to be at the midpoint between the first potential and the second potential.

First to fourth BTL amplifier units "B1" to "B4" are each provided with two amplifiers of the BTL (Bridge Tied Load or Balanced Transless) type that have an output bridge circuit in which output-stage transistors are bridge-connected.

The first BTL amplifier unit "B1" has a first output amplifier "A1" and a second output amplifier "A2" bridge-connected to each other, and outputs a first output signal obtained by amplifying a first input signal (a signal on a first channel "ch1") input to an input terminal "TIN1".

The first output amplifier "A1" has a current supply terminal to which a current is supplied, a current sweep-out terminal from which a current is swept out, and an output terminal "TA1" from which a signal is output, and the second output amplifier "A2" has a current supply terminal to which a current is supplied, a current sweep-out terminal from which a current is swept out, and an output terminal "TA2" from which a signal is output.

A speaker "S1", which is a load, is connected between the output terminals "TA1" and "TA2" of the first and second output amplifiers "A1" and "A2". When a first output signal is output (that is, a load current flows) between the output terminals of the first and second output amplifiers "A1" and "A2", a sound responsive to the first input signal is output from the speaker "S1".

The second BTL amplifier unit "B2" has a third output amplifier "A3" and a fourth output amplifier "A4" bridge-connected to each other, and outputs a second output signal obtained by amplifying a second input signal (a signal on a second channel "ch2") input to an input terminal "TIN2".

The third output amplifier "A3" has a current supply terminal to which a current is supplied, a current sweep-out terminal from which a current is swept out, and an output terminal "TA3" from which a signal is output, and the fourth output amplifier "A4" has a current supply terminal to which a current is supplied, a current sweep-out terminal from which a current is swept out, and an output terminal "TA4" from which a signal is output.

A speaker "S2", which is a load, is connected between the output terminals "TA3" and "TA4" of the third and fourth output amplifiers "A3" and "A4". When a second output signal is output (that is, a load current flows) between the output terminals "TA3" and "TA4" of the third and fourth output amplifiers "A3" and "A4", a sound responsive to the second input signal is output from the speaker "S2".

The third BTL amplifier unit "B3" has a fifth output amplifier "A5" and a sixth output amplifier "A6" bridge-connected to each other, and outputs a third output signal obtained by amplifying a third input signal (a signal on a third channel "ch3") input to an input terminal "TIN3".

The fifth output amplifier "A5" has a current supply terminal to which a current is supplied, a current sweep-out terminal from which a current is swept out, and an output terminal "TA5" from which a signal is output, and the sixth output amplifier "A6" has a current supply terminal to which a current is supplied, a current sweep-out terminal from which a current is swept out, and an output terminal "TA6" from which a signal is output.

A speaker "S3", which is a load, is connected between the output terminals "TA5" and "TA6" of the fifth and sixth output amplifiers "A5" and "A6". When a third output signal is output (that is, a load current flows) between the output terminals "TA5" and "TA6" of the fifth and sixth output amplifiers "A5" and "A6", a sound responsive to the third input signal is output from the speaker "S3".

The fourth BTL amplifier unit "B4" has a seventh output amplifier "A7" and an eighth output amplifier "A8" bridge-connected to each other, and outputs a fourth output signal obtained by amplifying a fourth input signal (a signal on a fourth channel "ch4") input to an input terminal "TIN4".

The seventh output amplifier "A7" has a current supply terminal to which a current is supplied, a current sweep-out terminal from which a current is swept out, and an output terminal "TA7" from which a signal is output, and the eighth output amplifier "A8" has a current supply terminal to which a current is supplied, a current sweep-out terminal from which a current is swept out, and an output terminal "TA8" from which a signal is output.

A speaker "S4", which is a load, is connected between the output terminals "TA7" and "TA8" of the seventh and eighth output amplifiers "A7" and "A8". When a fourth output signal is output (that is, a load current flows) between the output terminals "TA7" and "TA8" of the seventh and eighth output amplifiers "A7" and "A8", a sound responsive to the fourth input signal is output from the speaker "S4".

In response to the first output signal from the first BTL amplifier unit "B1", the first connecting circuit "SW1" connects the first and second output amplifiers "A1" and "A2" between the second potential line "LGND" and the third potential line "LM" or between the second potential line "LGND" and the first potential line "LVDD".

More specifically, in response to the first output signal, the first connecting circuit "SW1" connects the current supply terminals of the first and second output amplifiers "A1" and "A2" to the third potential line "LM" and the current sweep-out terminals of the first and second output amplifiers "A1" and "A2" to the second potential line "LGND", or connects the current supply terminals of the first and second output amplifiers "A1" and "A2" to the first potential line "LVDD" and the current sweep-out terminals of the first and second output amplifies "A1" and "A2" to the second potential line "LGND".

For example, if an amplitude of the first output signal is lower than a first output threshold, the first connecting circuit "SW1" connects the first and second output amplifiers "A1" and "A2" between the second potential line "LGND" and the third potential line "LM".

On the other hand, if the amplitude of the first output signal is equal to or higher than the first output threshold, the first connecting circuit "SW1" connects the first and second output amplifiers "A1" and "A2" between the second potential line "LGND" and the first potential line "LVDD".

As shown in FIG. 1, the first connecting circuit "SW1" has switch elements "SW1$p$" and "SW1$mn$", for example. The switch elements "SW1$p$" and "SW1$m$" switch the connection of the current supply terminals of the first and second output amplifiers "A1" and "A2" between the third potential line "LM" and the first potential line "LVDD".

In response to the second output signal from the second BTL amplifier unit "B2", the second connecting circuit "SW2" connects the third and fourth output amplifiers "A3" and "A4" between the first potential line "LVDD" and the third potential line "LM" or between the first potential line "LVDD" and the second potential line "LGND".

More specifically, in response to the second output signal, the second connecting circuit "SW2" connects the current supply terminals of the third and fourth output amplifiers "A3" and "A4" to the first potential line "LVDD" and the current sweep-out terminals of the third and fourth output amplifiers "A3" and "A4" to the third potential line "LM", or connects the current supply terminals of the third and fourth output amplifiers "A3" and "A4" to the first potential line "LVDD" and the current sweep-out terminals of the third and fourth output amplifies "A3" and "A4" to the second potential line "LGND".

For example, if an amplitude of the second output signal is lower than a second output threshold, the second connecting circuit "SW2" connects the third and fourth output amplifiers "A3" and "A4" between the first potential line "LVDD" and the third potential line "LM".

On the other hand, if the amplitude of the second output signal is equal to or higher than the second output threshold, the second connecting circuit "SW2" connects the third and fourth output amplifiers "A3" and "A4" between the first potential line "LVDD" and the second potential line "LGND".

As shown in FIG. 1, the second connecting circuit "SW2" has switch elements "SW2$p$" and "SW2$m$", for example.

The switch elements "SW2p" and "SW2m" switch the connection of the current sweep-out terminals of the third and fourth output amplifiers "A3" and "A4" between the third potential line "LM" and the second potential line "LGND".

In response to the third output signal from the third BTL amplifier unit "B3", the third connecting circuit "SW3" connects the fifth and sixth output amplifiers "A5" and "A6" between the second potential line "LGND" and the third potential line "LM" or between the second potential line "LGND" and the first potential line "LVDD".

More specifically, in response to the third output signal, the third connecting circuit "SW3" connects the current supply terminals of the fifth and sixth output amplifiers "A5" and "A6" to the third potential line "LM" and the current sweep-out terminals of the fifth and sixth output amplifiers "A5" and "A6" to the second potential line "LGND", or connects the current supply terminals of the fifth and sixth output amplifiers "A5" and "A6" to the first potential line "LVDD" and the current sweep-out terminals of the fifth and sixth output amplifies "A5" and "A6" to the second potential line "LGND".

For example, if an amplitude of the third output signal is lower than the first output threshold, the third connecting circuit "SW3" connects the fifth and sixth output amplifiers "A5" and "A6" between the second potential line "LGND" and the third potential line "LM".

On the other hand, if the amplitude of the third output signal is equal to or higher than the first output threshold, the third connecting circuit "SW3" connects the fifth and sixth output amplifiers "A5" and "A6" between the second potential line "LGND" and the first potential line "LVDD".

As shown in FIG. 1, the third connecting circuit "SW3" has switch elements "SW3p" and "SW3m", for example. The switch elements "SW3p" and "SW3m" switch the connection of the current supply terminals of the fifth and sixth output amplifiers "A5" and "A6" between the third potential line "LM" and the first potential line "LVDD".

In response to the fourth output signal from the fourth BTL amplifier unit "B4", the fourth connecting circuit "SW4" connects the seventh and eighth output amplifiers "A7" and "A8" between the first potential line "LVDD" and the third potential line "LM" or between the first potential line "LVDD" and the second potential line "LGND".

More specifically, in response to the fourth output signal, the fourth connecting circuit "SW4" connects the current supply terminals of the seventh and eighth output amplifiers "A7" and "A8" to the first potential line "LVDD" and the current sweep-out terminals of the seventh and eighth output amplifiers "A7" and "A8" to the third potential line "LM", or connects the current supply terminals of the seventh and eighth output amplifiers "A7" and "A8" to the first potential line "LVDD" and the current sweep-out terminals of the seventh and eighth output amplifies "A7" and "A8" to the second potential line "LGND".

For example, if an amplitude of the fourth output signal is lower than the second output threshold, the fourth connecting circuit "SW4" connects the seventh and eighth output amplifiers "A7" and "A8" between the first potential line "LVDD" and the third potential line "LM".

On the other hand, if the amplitude of the fourth output signal is equal to or higher than the second output threshold, the fourth connecting circuit "SW4" connects the seventh and eighth output amplifiers "A7" and "A8" between the first potential line "LVDD" and the second potential line "LGND".

As shown in FIG. 1, the fourth connecting circuit "SW4" has switch elements "SW4p" and "SW4m", for example. The switch elements "SW4p" and "SW4m" switch the connection of the current sweep-out terminals of the seventh and eighth output amplifiers "A7" and "A8" between the third potential line "LM" and the second potential line "LGND".

The first and second output thresholds described above are set to be equal to or lower than a half of the potential difference between the first potential "VDD" and the second potential "GND".

In response to the first and third input signals, the low potential-side switching circuit "SWF" is turned on to establish the connection between the second output amplifier "A2" and the fifth output amplifier "A5" or is turned off to break the connection between the second output amplifier "A2" and the fifth output amplifier "A5".

If the amplitude of at least one of the first input signal and the third input signal is equal to or higher than a first input threshold, the first comparator "CF" outputs a signal that turns off the low potential-side switching circuit "SWF".

Thus, if the amplitude of at least one of the first input signal and the third input signal is equal to or higher than the first input threshold, the low potential-side switching circuit "SWF" is turned off.

On the other hand, if the amplitudes of both the first input signal and the third input signal are lower than the first input threshold, the first comparator "CF" outputs a signal that turns on the low potential-side switching circuit "SWF".

Thus, if the amplitudes of both the first input signal and the third input signal are lower than the first input threshold, the low potential-side switching circuit "SWF" is turned on.

The first input threshold is set so that the amplitudes of the first and third output signals are equal to or lower than a fourth of the power supply voltage when the amplitudes of the first and third input signals are equal to or lower than the first input threshold.

In response to the second and fourth input signals, the high potential-side switching circuit "SWR" is turned on to establish the connection between the fourth output amplifier "A4" and the seventh output amplifier "A7" or is turned off to break the connection between the fourth output amplifier "A4" and the seventh output amplifier "A7".

If the amplitude of at least one of the second input signal and the fourth input signal is equal to or higher than a second input threshold, the second comparator "CR" outputs a signal that turns off the high potential-side switching circuit "SWR".

Thus, if the amplitude of at least one of the second input signal and the fourth input signal is equal to or higher than the second input threshold, the high potential-side switching circuit "SWR" is turned off.

On the other hand, if the amplitudes of both the second input signal and the fourth input signal are lower than the second input threshold, the second comparator "CR" outputs a signal that turns on the high potential-side switching circuit "SWR".

Thus, if the amplitudes of both the second input signal and the fourth input signal are lower than the second input threshold, the high potential-side switching circuit "SWR" is turned on.

The second input threshold is set so that the amplitudes of the second and fourth output signals are equal to or lower than a fourth of the power supply voltage when the amplitudes of the second and fourth input signals are equal to or lower than the second input threshold.

As described above, the thresholds for the input signals that control the low potential-side switching circuit "SWF" and the high potential-side switching circuit "SWR" are set so that the level of the output signal between the involved BTL amplifier units does not exceed a fourth of the power supply voltage.

In response to the state (on or off) of the low potential-side switching circuit "SWF" and the first input signal, the first controlling circuit "FBN1" controls the outputs of the first and second output amplifiers "A1" and "A2" of the first BTL amplifier unit "B1".

The first controlling circuit "FBN1" controls gains of the first and second output amplifiers "A1" and "A2" in such a manner that a differential gain of the first output signal with respect to the first input signal of the first BTL amplifier unit "B1" is a prescribed constant value.

If the first input signal is null, the first controlling circuit "FBN1" sets direct-current voltages at the output terminals "TA1" and "TA2" of the first BTL amplifier unit "B1" at a fourth potential.

In response to the state (on or off) of the low potential-side switching circuit "SWF" and the third input signal, the third controlling circuit "FBN3" controls the outputs of the fifth and sixth output amplifiers "A5" and "A6" of the third BTL amplifier unit "B3".

The third controlling circuit "FBN3" controls gains of the fifth and sixth output amplifiers "A5" and "A6" in such a manner that a differential gain of the third output signal with respect to the third input signal of the third BTL amplifier unit "B3" is a prescribed constant value.

If the third input signal is null, the third controlling circuit "FBN3" sets direct-current voltages at the output terminals "TA5" and "TA6" of the third BTL amplifier unit "B3" at the fourth potential.

The fourth potential is set to be a fourth of the first potential "VDD" (power supply voltage), which is at the midpoint between the second potential "GND" and the third potential "VDD/2", for example.

If the low potential-side switching circuit "SWF" is in the on state, the first controlling circuit "FBN1" sets the output of the second output amplifier "A2" at a first reference potential, and the third controlling circuit "FBN3" sets the output of the fifth output amplifier "A5" at the first reference potential.

Furthermore, if the low potential-side switching circuit "SWF" is in the on state, the second output amplifier and the fifth output amplifier are controlled to operate in parallel with each other. For example, the second output amplifier "A2" and the fifth output amplifier "A5" can be controlled to make the output current of the second output amplifier "A2" and the output current of the fifth output amplifier "A5" equal to each other. On the other hand, if the low potential-side switching circuit "SWF" is in the off state, the first controlling circuit "FBN1" controls the output of the first output amplifier "A1" so as to maintain the output potential of the first output amplifier "A1" immediately before the low potential-side switching circuit "SWF" is turned off, unless the output of the second output amplifier "A2" clips.

Furthermore, if the low potential-side switching circuit is in the off state, the third controlling circuit "FBN3" controls the output of the sixth output amplifier "A6" so as to maintain the output potential of the sixth output amplifier "A6" immediately before the low potential-side switching circuit is turned off, unless the output of the fifth output amplifier "A5" clips.

In response to the state (on or off) of the high potential-side switching circuit "SWR" and the second input signal, the second controlling circuit "FBN2" controls the outputs of the third and fourth output amplifiers "A3" and "A4" of the second BTL amplifier unit "B2".

The second controlling circuit "FBN2" controls gains of the third and fourth output amplifiers "A3" and "A4" in such a manner that a differential gain of the second output signal with respect to the second input signal of the second BTL amplifier unit "B2" is a prescribed constant value.

If the second input signal is null, the second controlling circuit "FBN2" sets direct-current voltages at the output terminals "TA3" and "TA4" of the second BTL amplifier unit "B2" at a fifth potential.

In response to the state (on or off) of the high potential-side switching circuit "SWR" and the fourth input signal, the fourth controlling circuit "FBN4" controls the outputs of the seventh and eighth output amplifiers "A7" and "A8" of the fourth BTL amplifier unit "B4".

The fourth controlling circuit "FBN4" controls gains of the seventh and eighth output amplifiers "A7" and "A8" in such a manner that a differential gain of the fourth output signal with respect to the fourth input signal of the fourth BTL amplifier unit "B4" is a prescribed constant value.

If the fourth input signal is null, the fourth controlling circuit "FBN4" sets direct-current voltages at the output terminals "TA7" and "TA8" of the fourth BTL amplifier unit "B4" at the fifth potential.

The fifth potential is set to be three fourths of the first potential "VDD" (power supply voltage), which is at the midpoint between the third potential "VDD/2" and the first potential "VDD", for example.

If the high potential-side switching circuit "SWR" is in the on state, the second controlling circuit "FBN2" sets the output of the fourth output amplifier "A4" at a second reference potential, and the fourth controlling circuit "FBN4" sets the output of the seventh output amplifier "A7" at the second reference potential.

Furthermore, if the high potential-side switching circuit "SWR" is in the on state, the fourth output amplifier and the seventh output amplifier are controlled to operate in parallel with each other. For example, the fourth output amplifier "A4" and the seventh output amplifier "A7" can be controlled to make the output current of the fourth output amplifier "A4" and the output current of the seventh output amplifier "A7" equal to each other.

On the other hand, if the high potential-side switching circuit "SWR" is in the off state, the second controlling circuit "FBN2" controls the output of the third output amplifier "A3" so as to maintain the output potential of the third output amplifier "A3" immediately before the high potential-side switching circuit "SWR" is turned off, unless the output of the fourth output amplifier "A4" clips.

Furthermore, if the high potential-side switching circuit "SWR" is in the off state, the fourth controlling circuit "FBN4" controls the output of the eighth output amplifier "A8" so as to maintain the output potential of the eighth output amplifier "A8" immediately before the high potential-side switching circuit "SWR" is turned off, unless the output of the seventh output amplifier "A7" clips.

Figure 2:
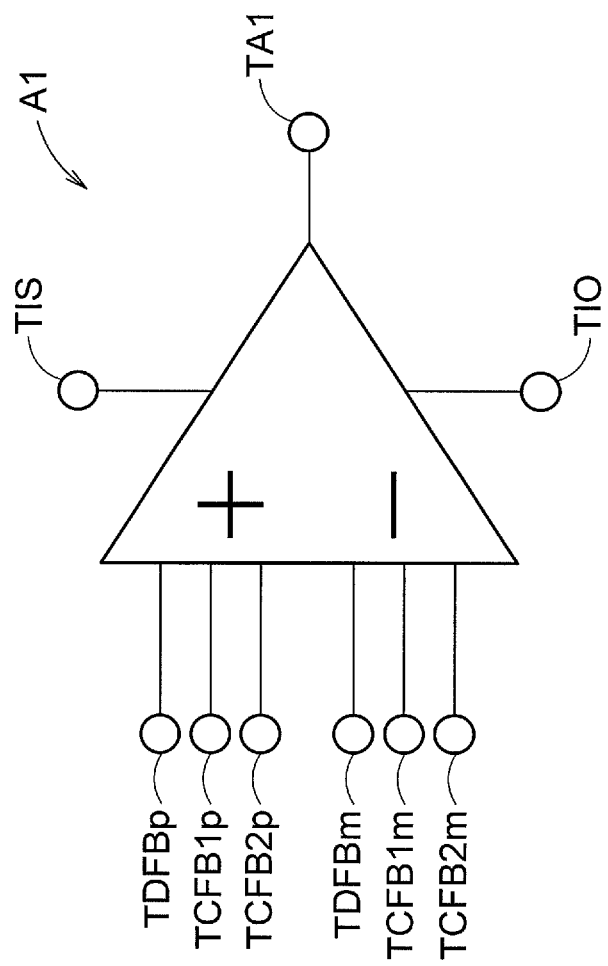
FIG. 2 is a diagram for illustrating the terminals of the first output amplifier "A1" shown in FIG. 1.

FIG. 2 is a diagram for illustrating the terminals of the first output amplifier "A1" shown in FIG. 1. The other second to eighth output amplifiers "A2" to "A8" have the same configuration as the first output amplifier "A1".

As shown in FIG. 2, the first output amplifier "A1" has a positive-phase inputs "TCFB1$p$", "TDFBp" and "TCFB2$p$" and reverse-phase inputs "TCFB1$m$", "TDFBm" and "TCFB2*m*". Current supply to the output terminal "TA1" is achieved through a current supply terminal "TIS", and a current flowing into the first output amplifier "A1" through the output terminal "TA1" flows to a current sweep-out terminal "TIO".

Figure 3:
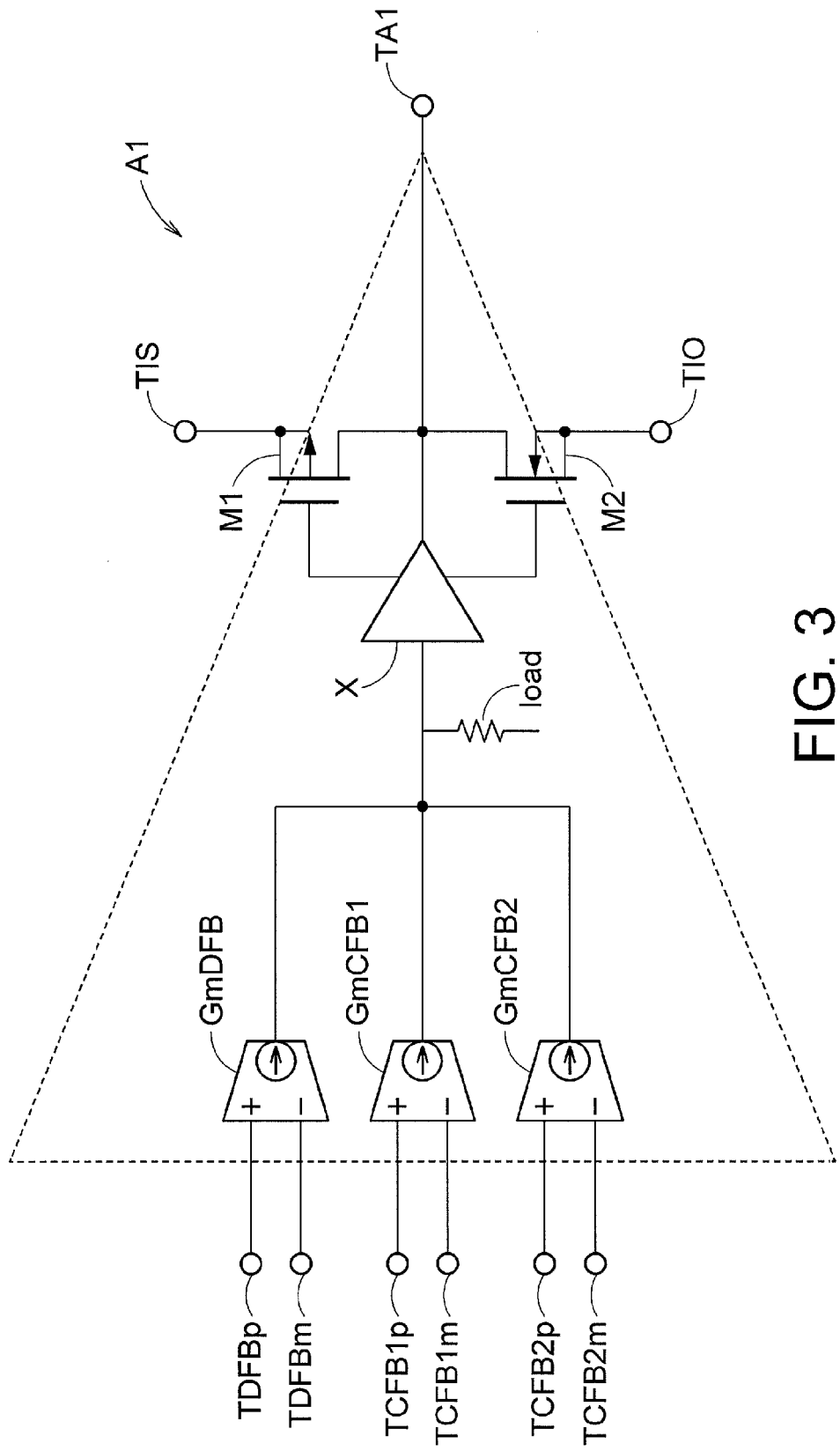
FIG. 3 is a diagram showing an example of the configuration of the first output amplifier "A1" shown in FIG. 2.

FIG. 3 is a diagram showing an example of the configuration of the first output amplifier "A1" shown in FIG. 2. The other second to eighth output amplifiers "A2" to "A8" have the same configuration as the first output amplifier "A1".

As shown in FIG. 3, the first output amplifier "A1" includes differential input transconductance (gm) circuits "GmDFB", "GmCFB1" and "GmCFB2", an internal load "load", a driver "X", and a first MOS transistor (pMOS transistor) "M1" and a second MOS transistor (nMOS transistor) "M2", which are complementary to each other.

The first MOS transistor "M1" is connected to the current supply terminal "TIS" at one end (source) of a current path thereof and to the output terminal "TA1" at another end (drain) of the current path thereof.

The second MOS transistor "M2" is connected to the output terminal "TA1" at one end (drain) of a current path thereof and to the current sweep-out terminal "TIO" at another end (source) of the current path thereof.

The gm circuit "GmDFB" outputs a current in response to the potential difference between the first positive-phase input "TDFBp" and the first reverse-phase input "TDFBm".

The gm circuit "GmCFB1" outputs a current in response to the potential difference between the second positive-phase input "TCFB1*p*" and the second reverse-phase input "TCFB1*m*".

The gm circuit "GmCFB2" outputs a current in response to the potential difference between the third positive-phase input "TCFB2*p*" and the third reverse-phase input "TCFB2*m*".

gm (transconductance) of the three gm circuits "GmDFB", "GmCFB1" and "GmCFB2" are set at any value. The outputs of the three gm circuits "GmDFB", "GmCFB1" and "GmCFB2" are combined to drive the internal load "load". The I/V-converted output is further amplified by the driver "X" in the following stage. The first and second MOS transistors "M1" and "M2" in a push-pull configuration are driven by the output of the driver "X".

In this way, the three gm circuits "GmDFB", "GmCFB1" and "GmCFB2" control the first and second MOS transistors "M1" and "M2" to determine the voltage at the output terminal "TA1".

According to this embodiment, when the potential at the positive-phase input terminal is higher than the potential at the reverse-phase input terminal, each gm circuit operates to amplify the voltage at the output terminal in the positive phase.

However, if the potential at the reverse-phase input of any of the three gm circuits "GmDFB", "GmCFB1" and "GmCFB2" is higher than the potential at the positive-phase input, for example, the voltage at the load "load" is determined by the sum of the output currents of the gm circuits.

If the voltage at the load "load" has a positive amplitude, the potential at the output terminal is also amplified in the positive phase. If the voltage at the load "load" has a negative amplitude, the potential at the output terminal is also amplified in the reverse phase.

That is, the first output amplifier "A1" turns on or off the first MOS transistor "M1" and the second MOS transistor "M2" in a complementary manner in response to the potential difference between the first positive-phase input "TDFBp" and the first reverse-phase input "TDFBm", the potential difference between the second positive-phase input "TCFB1*p*" and the second reverse-phase input "TCFB1*m*", and the potential difference between the third positive-phase input "TCFB2*p*" and the third reverse-phase input "TCFB2*m*" of the first output amplifier "A1".

Figure 4:
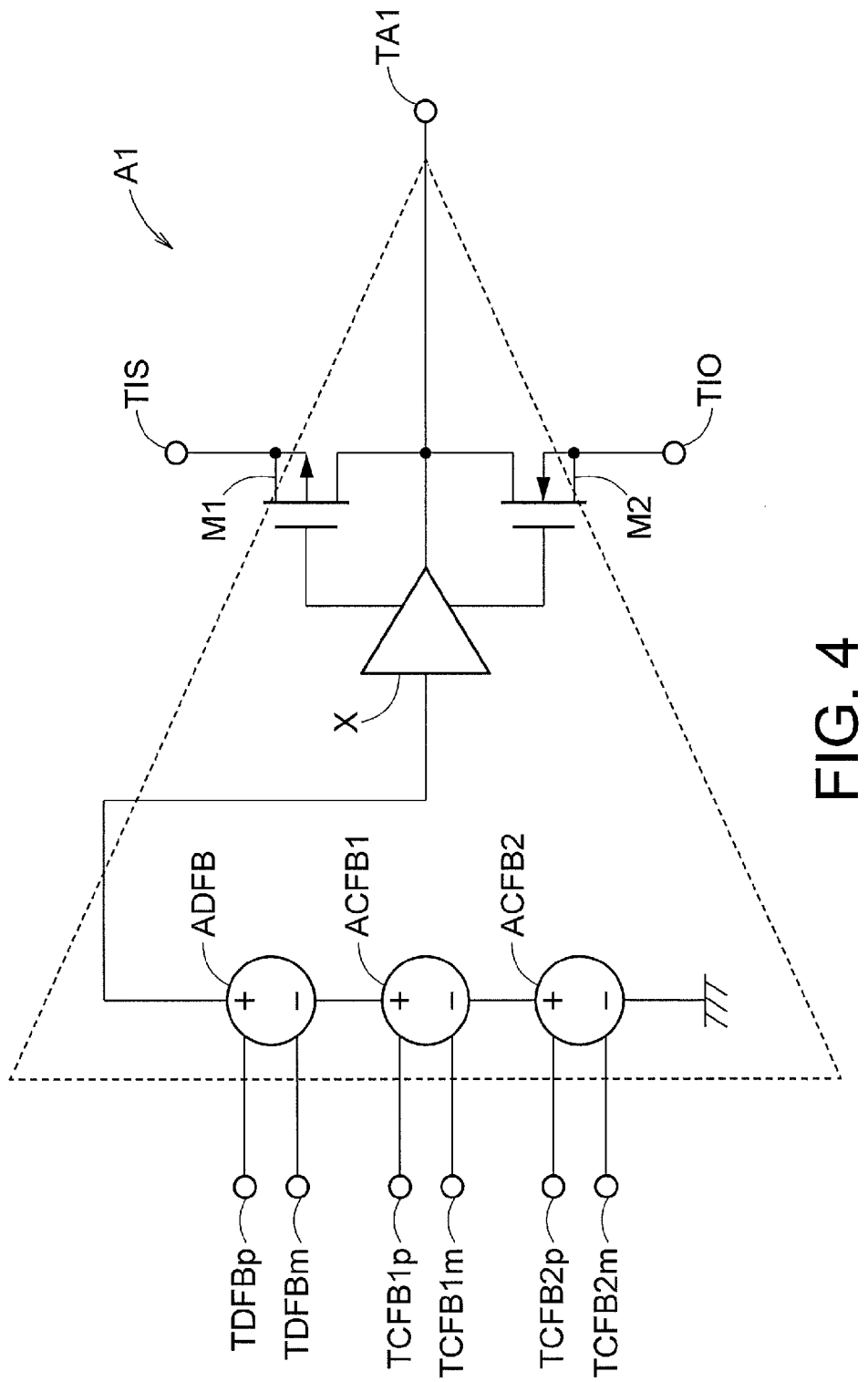
FIG. 4 is a diagram showing another example of the configuration of the first output amplifier "A1" shown in FIG. 2.

FIG. 4 is a diagram showing another example of the configuration of the first output amplifier "A1" shown in FIG. 2. The other second to eighth output amplifiers "A2" to "A8" have the same configuration as the first output amplifier "A1".

The first output amplifier "A1" includes differential input voltage controlled voltage sources (vcvs) circuits "ADFB", "ACFB1" and "ACFB2", a driver "X", and a first MOS transistor (pMOS transistor) "M1" and a second MOS transistor (nMOS transistor) "M2", which are complementary to each other.

The first MOS transistor "M1" is connected to the current supply terminal "TIS" at one end (source) of a current path thereof and to the output terminal "TA1" at another end (drain) of the current path thereof.

The second MOS transistor "M2" is connected to the output terminal "TA1" at one end (drain) of a current path thereof and to the current sweep-out terminal "TIO" at another end (source) of the current path thereof.

The voltage controlled voltage source circuit "ADFB" outputs a voltage in response to the potential difference between the first positive-phase input "TDFBp" and the first reverse-phase input "TDFBm".

The voltage controlled voltage source circuit "ACFB1" outputs a voltage in response to the potential difference between the second positive-phase input "TCFB1*p*" and the second reverse-phase input "TCFB1*m*".

The voltage controlled voltage source circuit "ACFB2" outputs a voltage in response to the potential difference between the third positive-phase input "TCFB2*p*" and the third reverse-phase input "TCFB2*m*".

Amplification factors of the voltage controlled voltage source circuits "ADFB", "ACFB1" and "ACFB2" are set at any value. The outputs of the three voltage controlled voltage source circuits "ADFB", "ACFB1" and "ACFB2" are summed and further amplified by the driver "X" in the following stage.

In this example, when the potential at the positive-phase input terminal is higher than the potential at the reverse-phase input terminal, each voltage controlled voltage source circuit performs amplification in the positive phase. If the output obtained by summing the outputs of the three voltage controlled voltage source circuits "ADFB", "ACFB1" and "ACFB2" is in the positive phase, the voltage controlled voltage source circuits operate to amplify the voltage at the output terminal in the positive phase.

That is, the first output amplifier "A1" turns on or off the first MOS transistor "M1" and the second MOS transistor "M2" in a complementary manner in response to the potential difference between the first positive-phase input "TDFBp" and the first reverse-phase input "TDFBm", the potential difference between the second positive-phase input "TCFB1*p*" and the second reverse-phase input "TCFB1*m*", and the potential difference between the third positive-phase input "TCFB2*p*" and the third reverse-phase input "TCFB2*m*" of the first output amplifier "A1".

As can be seen from these specific examples of the output amplifier shown in FIGS. 3 and 4, as far as the low potential-side switching circuit "SWF" is in the on state, the output current of the second output amplifier "A2" and the output current of the fifth output amplifier "A5" can be controlled to be equal to each other by short-circuiting a gate of the first MOS transistor "M1" of the second output amplifier and a gate of the first MOS transistor "M1" of the fifth output amplifier and short-circuiting a gate of the second MOS transistor "M2" of the second output amplifier and a gate of the second MOS transistor "M2" of the fifth output amplifier, since the output of the second output amplifier "A2" and the output of the fifth output amplifier "A5" are set at the first reference potential.

Furthermore, as can be seen from these specific examples of the output amplifier shown in FIGS. 3 and 4, as far as the high potential-side switching circuit "SWR" is in the on state, the output current of the fourth output amplifier "A4" and the output current of the seventh output amplifier "A7" can be controlled to be equal to each other by short-circuiting a gate of the first MOS transistor "M1" of the fourth output amplifier and a gate of the first MOS transistor "M1" of the seventh output amplifier and short-circuiting a gate of the second MOS transistor "M2" of the fourth output amplifier and a gate of the second MOS transistor "M2" of the seventh output amplifier, since the output of the fourth output amplifier "A4" and the output of the seventh output amplifier "A7" are set at the second reference potential.

Figure 5:
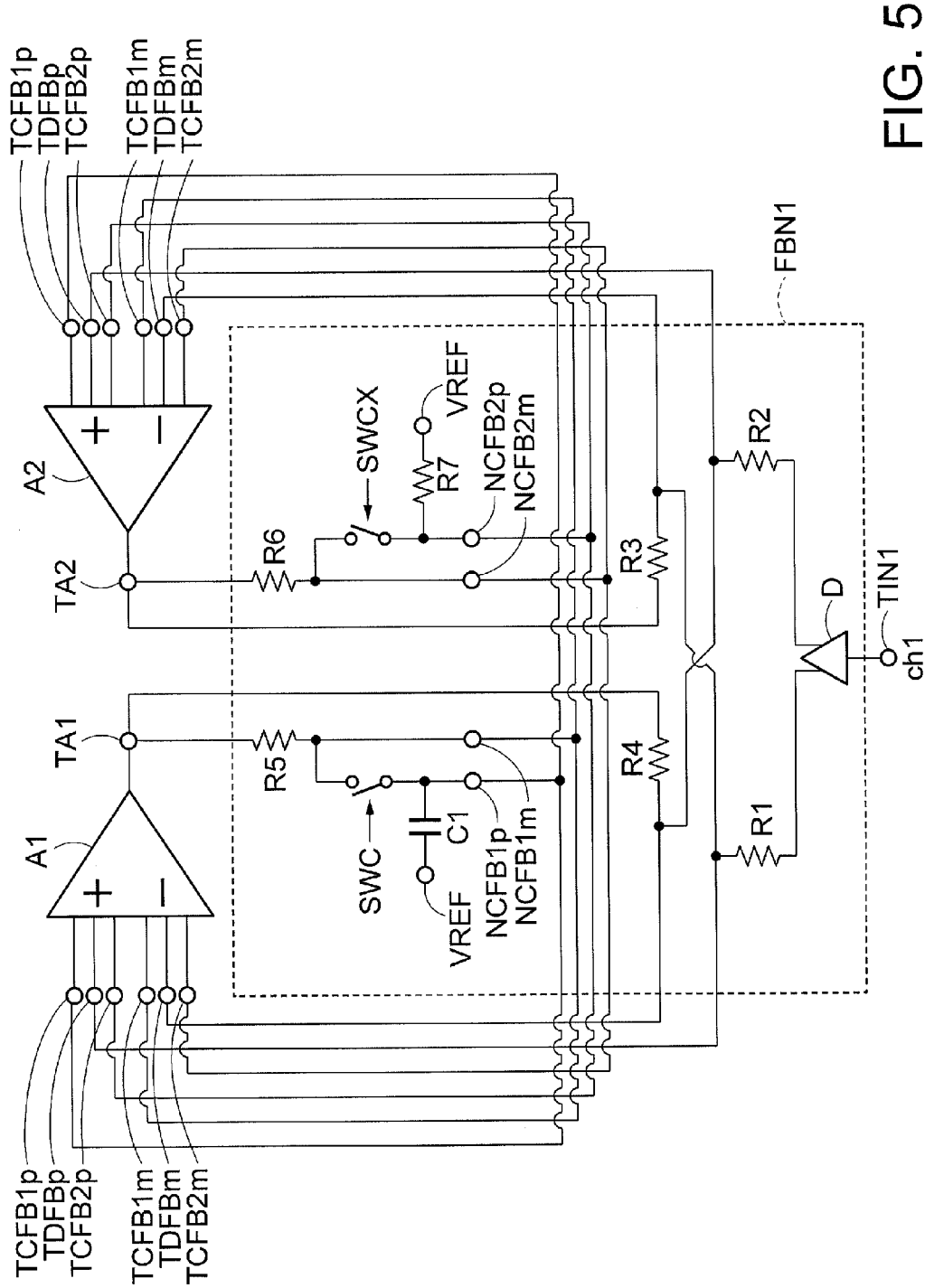
FIG. 5 is a diagram showing an example of a configuration of the first controlling circuit "FBN1" shown in FIG. 1.

FIG. 5 is a diagram showing an example of a configuration of the first controlling circuit "FBN1" shown in FIG. 1. The second to fourth controlling circuits "FBN2" to "FBN4" have the same configuration as the first controlling circuit "FBN1".

As shown in FIG. 5, the first controlling circuit "FBN1" includes a differential output circuit "D", a first resistor "R1", a second resistor "R2", a third resistor "R3", a fourth resistor "R4", a fifth resistor "R5", a sixth resistor "R6", a seventh resistor "R7", a first controlling switch "SWC", a second controlling switch "SWCX", and a capacitor "C1".

The differential output circuit "D" receives the first input signal at an input thereof and outputs differential signals based on the first input signal at a first output and a second output thereof.

The first resistor "R1" is connected to the first output of the differential output circuit "D" at one end thereof, and to the first positive-phase input "TDFBp" of the first output amplifier "A1" and the first reverse-phase input "TDFBm" of the second output amplifier "A2" at another end thereof.

The second resistor "R2" is connected to the second output of the differential output circuit "D" at one end thereof, and to the first positive-phase input "TDFBp" of the second output amplifier "A2" and the first reverse-phase input "TDFBm" of the first output amplifier "A1" at another end thereof.

The third resistor "R3" is connected to the another end of the first resistor "R1" at one end thereof and to the output terminal "TA2" of the second output amplifier "A2" at another end thereof.

The fourth resistor "R4" is connected to the another end of the second resistor "R2" at one end thereof and to the output terminal "TA1" of the first output amplifier "A1" at another end thereof.

The fifth resistor "R5" is connected to the output terminal "TA1" of the first output amplifier "A1" at one end thereof, and to the second reverse-phase input "TCFB1m" of the first output amplifier "A1" and the second reverse-phase input "TCFB1m" of the second output amplifier "A2" at another end thereof.

The first controlling switch "SWC" is connected to the another end of the fifth resistor "R5" at one end of a current path thereof, and to the second positive-phase input "TCFB1p" of the first output amplifier "A1" and the second positive-phase input "TCFB1p" of the second output amplifier "A2" at another end of the current path thereof.

The first controlling switch "SWC" is turned on or off in synchronization with the low potential-side switching circuit "SWF" described above. That is, the first controlling switch "SWC" is in the on state when the low potential-side switching circuit "SWF" is in the on state, and in the off state when the low potential-side switching circuit "SWF" is in the off state.

The capacitor "C1" receives a reference voltage "VREF" at one end thereof and is connected to the another end of the current path of the first controlling switch "SWC" at another end thereof.

The sixth resistor "R6" is connected to the output terminal "TA2" of the second output amplifier "A2" at one end thereof, and to the third reverse-phase input "TCFB2m" of the first output amplifier "A1" and the third reverse-phase input "TCFB2m" of the second output amplifier "A2" at another end thereof.

The second controlling switch "SWCX" is connected to the another end of the sixth resistor "R6" at one end of a current path thereof, and to the third positive-phase input "TCFB2p" of the first output amplifier "A1" and the third positive-phase input "TCFB2p" of the second output amplifier "A2" at another end of the current path thereof.

The second controlling switch "SWCX" is turned on or off complementarily to the first controlling switch "SWC". That is, the second controlling switch "SWCX" is in the off state when the first controlling switch "SWC" is in the on state, and in the on state when the first controlling switch "SWC" is in the off state.

The seventh resistor "R7" receives the reference voltage "VREF" at one end thereof and is connected to the another end of the current path of the second controlling switch "SWCX" at another end thereof.

Of three control loops of the first controlling circuit "FBN1", a differential feedback loop defined by the first to fourth resistors "R1" to "R4" is always operating. The differential feedback loop controls the potential difference (signal) between the first positive-phase input "TDFBp" and the first reverse-phase input "TDFBm" so as to always keep the gain of the potential difference (output voltage) between the output terminal "TA1" and the output terminal "TA2" with respect to the terminal "TIN1" substantially constant.

That is, as described above, the first controlling circuit "FBN1" controls the gains of the first and second amplifiers "A1" and "A2" in such a manner that the differential gain of the first output signal with respect to the first input signal of the first BTL amplifier unit "B1" is a prescribed constant value.

A feedback control loop defined by the fifth resistor "R5", the capacitor "C1" and the reference voltage "VREF" controls the potential difference (signal) between the second positive-phase input "TCFB1p" and the second reverse-phase input "TCFB1m".

A feedback control loop defined by the sixth resistor "R6", the seventh resistor "R7" and the reference voltage "VREF" controls the potential difference (signal) between the third positive-phase input "TCFB2p" and the third reverse-phase input "TCFB2m".

The first output amplifier "A1" outputs, at the output terminal "TA1", a signal responsive to the potential difference between the first positive-phase input "TDFBp" and the first reverse-phase input "TDFBm", the potential difference between the second positive-phase input "TCFB1p" and the second reverse-phase input "TCFB1m" and the potential difference between the third positive-phase input "TCFB2p" and the third reverse-phase input "TCFB2m" of the first output amplifier "A1".

The second output amplifier "A2" outputs, at the output terminal "TA2", a signal responsive to the potential difference between the first positive-phase input "TDFBp" and the first reverse-phase input "TDFBm", the potential difference between the second positive-phase input "TCFB1p" and the second reverse-phase input "TCFB1m" and the potential difference between the third positive-phase input "TCFB2p" and the third reverse-phase input "TCFB2m" of the second output amplifier "A2".

In a period in which the first controlling switch "SWC" is in the on state (a period in which the second controlling switch "SWCX" is in the off state), the potential difference between a node "NCFB1p" and a node "NCFB1m" is zero. In this period, the capacitor "C1" is charged through the resistor "R5" so that the voltage at the node "NCFB1p" connected to the capacitor "C1" becomes equal to the voltage at the output terminal "TA1" (sample mode).

In this period, since the potential difference between the node "NCFB1p" and the node "NCFB1m" is zero, the output current of the gm circuit "GmCFB1" shown in FIG. 3 is zero, and the gm circuit "GmCFB1" makes no contribution to the operation of the output amplifier.

Furthermore, in this period, since the second controlling switch "SWCX" is in the off state, the gm circuit "GmCFB2" shown in FIG. 3 is controlled. That is, the voltage at the output terminal "TA2" is supplied to the third reverse-phase input "TCFB2m" through the sixth resistor "R6", and the reference voltage "VREF" is supplied to the third positive-phase input "TCFB2p" through the seventh resistor "R7". Therefore, the control loop for the third positive-phase input "TCFB2p" and the third reverse-phase input "TCFB2m" operates to make the voltage at the output terminal "TA2" equal to the reference voltage "VREF".

That is, when the low potential-side switching circuit "SWF" is in the on state (the first controlling switch "SWC" is in the on state and the second controlling switch "SWCX" is in the off state) as described above, the first controlling circuit "FBN1" sets the output of the second output amplifier "A2" at the first reference potential.

In a period in which the first controlling switch "SWC" is in the off state (a period in which the second controlling switch "SWCX" is in the on state), the potential difference between a node "NCFB2p" and a node "NCFB2m" is zero. Therefore, the output current of the gm circuit "GmCFB2" shown in FIG. 3 is zero, and the gm circuit "GmCFB2" makes no contribution to the operation of the output amplifier. Since the first controlling switch "SWC" is in the off state, the charges accumulated in the capacitor "C1" are held (hold mode).

In the hold mode, the potential at the output terminal "TA1" is supplied to the node "NCFB1m" through the fifth resistor "R5", and the voltage held in the capacitor "C1" is directly supplied to the node "NCFB1p". Therefore, the control loop for the second positive-phase input "TCFB1p" and the second reverse-phase input "TCFB1m" operates to make (i.e., sample hold) the voltage at the output terminal "TA1" equal to the value immediately before the first controlling switch "SWC" is turned off.

That is, when the low potential-side switching circuit "SWF" is in the off state as described above, the first controlling circuit "FBN1" controls the output of the first output amplifier "A1" so that the output potential of the first output amplifier "A1" immediately before the low potential-side switching circuit "SWF" is turned off is maintained, unless the output of the second output amplifier "A2" clips.

The differential feedback loop is only intended to make the differential gain constant and cannot determine the direct-current voltages at the output terminals "TA1" and "TA2". Therefore, the direct-current voltages at the output terminals "TA1" and "TA2" are determined by the control loop for the third positive-phase input "TCFB2p" and the third reverse-phase input "TCFB2m" or the control loop for the second positive-phase input "TCFB1p" and the second reverse-phase input "TCFB1m".

The second to fourth controlling circuits "FBN2" to "FBN4" perform the same controlling operation.

Figure 6:
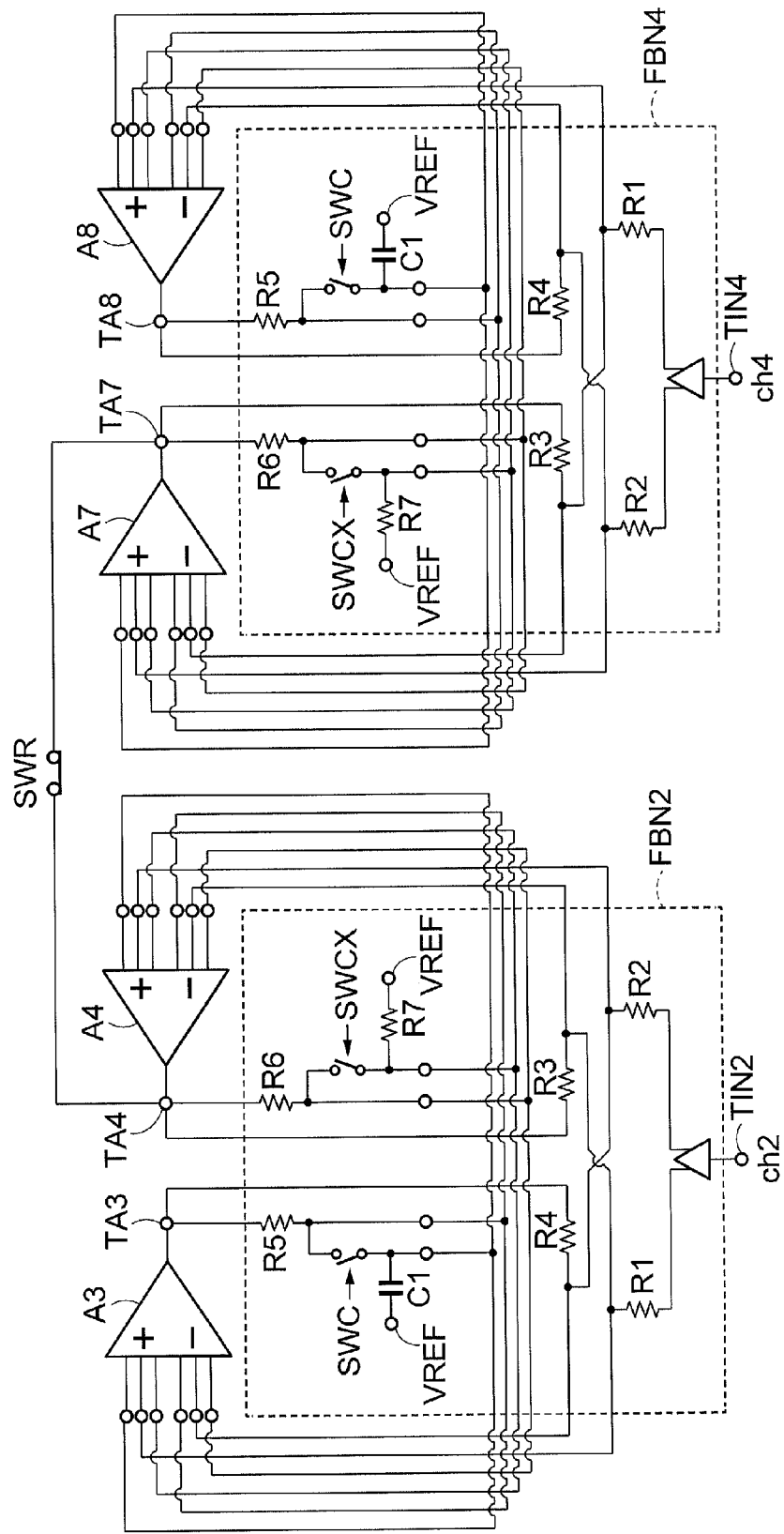
FIG. 6 is a diagram showing an example of a configuration of the second and fourth BTL amplifier units "B2" and "B4" shown in FIG. 1.
Figure 7:
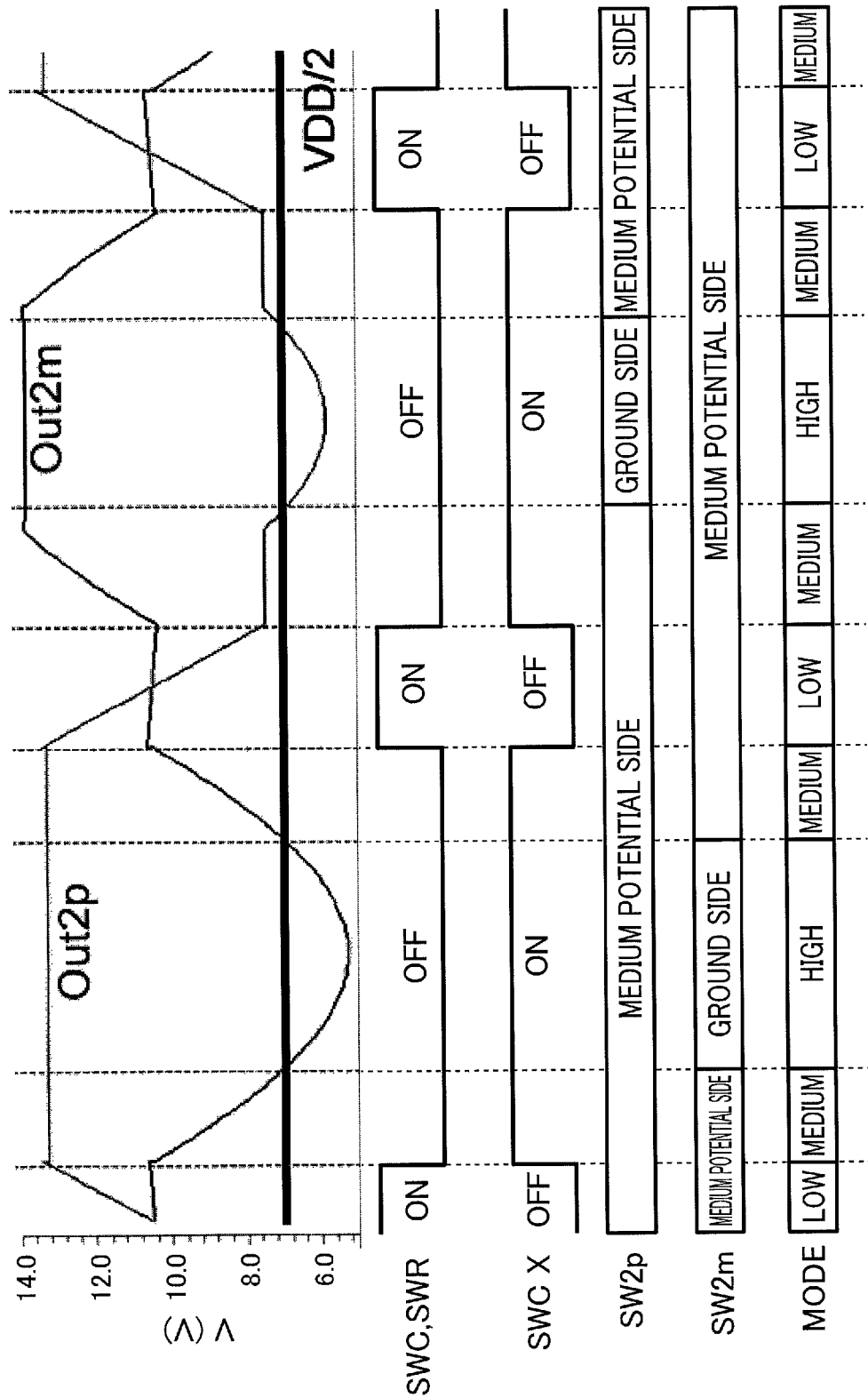
FIG. 7 is a diagram showing an example of a relationship between waveforms of output voltages "Out2p" and "Out2m" at the output terminals "TA3" and "TA4" of the third and fourth output amplifier "A3" and "A4" of the second BTL amplifier unit "B2", states of the first and second controlling switches "SWC" and "SWCX", the high potential-side switching circuit "SWR" and the switch elements "SW2p" and "SW2m", and modes.

Next, an example of a cycle of operation of the power amplifying device 100 from a low signal mode to a high signal mode will be described. FIG. 6 is a diagram showing an example of a configuration of the second and fourth BTL amplifier units "B2" and "B4" shown in FIG. 1. FIG. 7 is a diagram showing an example of a relationship between waveforms of output voltages "Out2p" and "Out2m" at the output terminals "TA3" and "TA4" of the third and fourth output amplifier "A3" and "A4" of the second BTL amplifier unit "B2", states of the first and second controlling switches "SWC" and "SWCX", the high potential-side switching circuit "SWR" and the switch elements "SW2p" and "SW2m", and modes.

In this example, a period in which the amplitude of the input signal on the second channel "ch2" is low (lower than the second input threshold), and the first controlling switch "SWC" and the high potential-side switching circuit "SWR" are in the on state is referred to as a low signal mode. Since the first controlling switch "SWC" is in the on state, the feedback loop operates to make the output voltage "Out2m" at the output terminal "TA4" shown in FIG. 6 equal to the reference voltage "VREF". The reference voltage "VREF" is set to be 3VDD/4.

For the output voltage "Out2p" at the output terminal "TA3", an output amplitude occurs, since the differential feedback control loop makes the differential gain constant. In the low signal mode, the current supplied to the load on the second channel "ch2" can be supplied to the load on the fourth channel "ch4". Since the output voltage "Out2m" is equal to or higher than the third potential "VDD/2" (the amplitude of the second output signal is lower than the second output threshold), the current sweep-out terminals of the third and fourth output amplifiers "A3" and "A4" are connected to the third potential line "LM", and the load current can be reused in the lower first and third BTL amplifier units "B1" and "B3". Therefore, the load current consumed on the fourth channel "ch4" can also be reused on the first and third channels "ch1" and "ch3".

When the amplitude of the input signal on the second channel "ch2" then becomes equal to or higher than the second input threshold, the first controlling switch "SWC" and the high potential-side switching circuit "SWR" are turned off. As a result, by the sample holding effect of the control loop described above, the output voltage "Out2p" (direct-current voltage) is maintained at the value immediately before the first controlling switch "SWC" is switched from the on state to the off state.

The control loop that makes the output voltage "Out2m" equal to the reference voltage "VREF" is not operating. However, since the differential feedback is maintained, an output amplitude of the output voltage "Out2m" occurs to set the differential gain at the prescribed constant value.

Since the output voltage "Out2m" is equal to or higher than the third potential "VDD/2" (the amplitude of the second output signal is lower than the second output threshold), the current sweep-out terminals of the third and fourth output amplifiers "A3" and "A4" are connected to the third potential line "LM", and the load current can be reused in the first and third BTL amplifier units "B1" and "B3" shown below the second and fourth BTL amplifier units "B2" and "B4". This state is referred to a medium signal mode.

Furthermore, when the amplitude of the input signal on the second channel "ch2" increases, and the output voltage "Out2m" becomes lower than the third potential "VDD/2" (the amplitude of the second output signal becomes equal to or greater than the second output threshold), the current sweep-out terminals of the third and fourth output amplifiers "A3" and "A4" are connected to the second potential line "LGND". In this state, the load current cannot be reused in the first and third BTL amplifier units "B1" and "B3" shown below the second and fourth BTL amplifier units "B2" and "B4". This state is referred to as a high signal mode.

Next, a period of the second half of the cycle of the sinusoidal wave input (a period in which the input amplitude is negative) will be described.

The period in which the amplitude of the sinusoidal wave input is negative is the period in which the output voltage "Out2m" is higher than the output voltage "Out2p" in FIG. 7. When the input level (second input threshold) at which switching from the low signal mode to the medium signal mode occurs is reached, the output voltage "Out2p" is sample-held at the value immediately before the switching and fixed at a level that does not exceed the third potential "VDD/2" (a potential slightly higher than 7V). For the output voltage "Out2p", an amplitude occurs because of the differential feedback. However, if the input signal amplitude further increases, the output voltage "Out2m" clips with respect to the first potential line "LVDD". Then, the amplitude of the output voltage "Out2m" cannot be further increased, so that the operation is determined by the extent of the operation of the differential feedback control loop in the second controlling circuit "FBN2" and the sample-hold control loop.

Referring to FIG. 3, the gm circuit "GmDFB" that performs the differential feedback control and the gm circuit "GmCFB1" that performs the sample-hold control can be configured so that the transconductance of the gm circuit "GmDFB" is greater than the transconductance of the gm circuit "GmCFB1". With such a configuration, the differential feedback loop is more effective than the sample-hold control loop. Therefore, as soon as the output voltage "Out2m" starts clipping, an output amplitude occurs in the output voltage "Out2p", which has been sample-held, in order to keep the differential gain constant, and a signal in the high signal mode can be obtained without distorting the BTL output.

As described above, the low signal mode, the medium signal mode and the high signal mode repeatedly occur in response to the input signal. However, the hold voltages of the output voltages "Out2p" and "Out2m" at the time when switching from the low signal mode to the medium signal mode occurs are set not to exceed the third potential "VDD/2".

If switching of the first controlling switch "SWC" does not occur until the output voltage "Out2p" or "Out2m" exceeds the third potential "VDD/2", the current sweep-out terminals of the third and fourth output amplifiers "A3" and "A4" are connected to the second potential line "LGND", rather than the third potential "VDD/2". In that case, the medium signal mode is skipped, and the efficiency improvement effect decreases.

In actuality, the on-resistance of the high potential-side switching circuit "SWR" is not zero but has a finite value. Therefore, there is a need to improve the current reuse efficiency by making the output currents at the output terminals "TA4" and "TA7" of the fourth and seventh output amplifiers "A4" and "A7" connected by the high potential-side switching circuit "SWR" in the low signal mode equal to each other. As can be seen from the specific examples of the output amplifier shown in FIGS. 3 and 4, as far as the high potential-side switching circuit "SWR" is in the on state, the output current of the fourth output amplifier "A4" and the output current of the seventh output amplifier "A7" can be controlled to be equal to each other by short-circuiting the gate of the first MOS transistor "M1" of the fourth output amplifier and the gate of the first MOS transistor "M1" of the seventh output amplifier and short-circuiting the gate of the second MOS transistor "M2" of the fourth output amplifier and the gate of the second MOS transistor "M2" of the seventh output amplifier, since the output of the fourth output amplifier "A4" and the output of the seventh output amplifier "A7" are set at the second reference potential.

Next, characteristics of the operation of the power amplifying device 100 configured as described above will be described.

Figure 8:
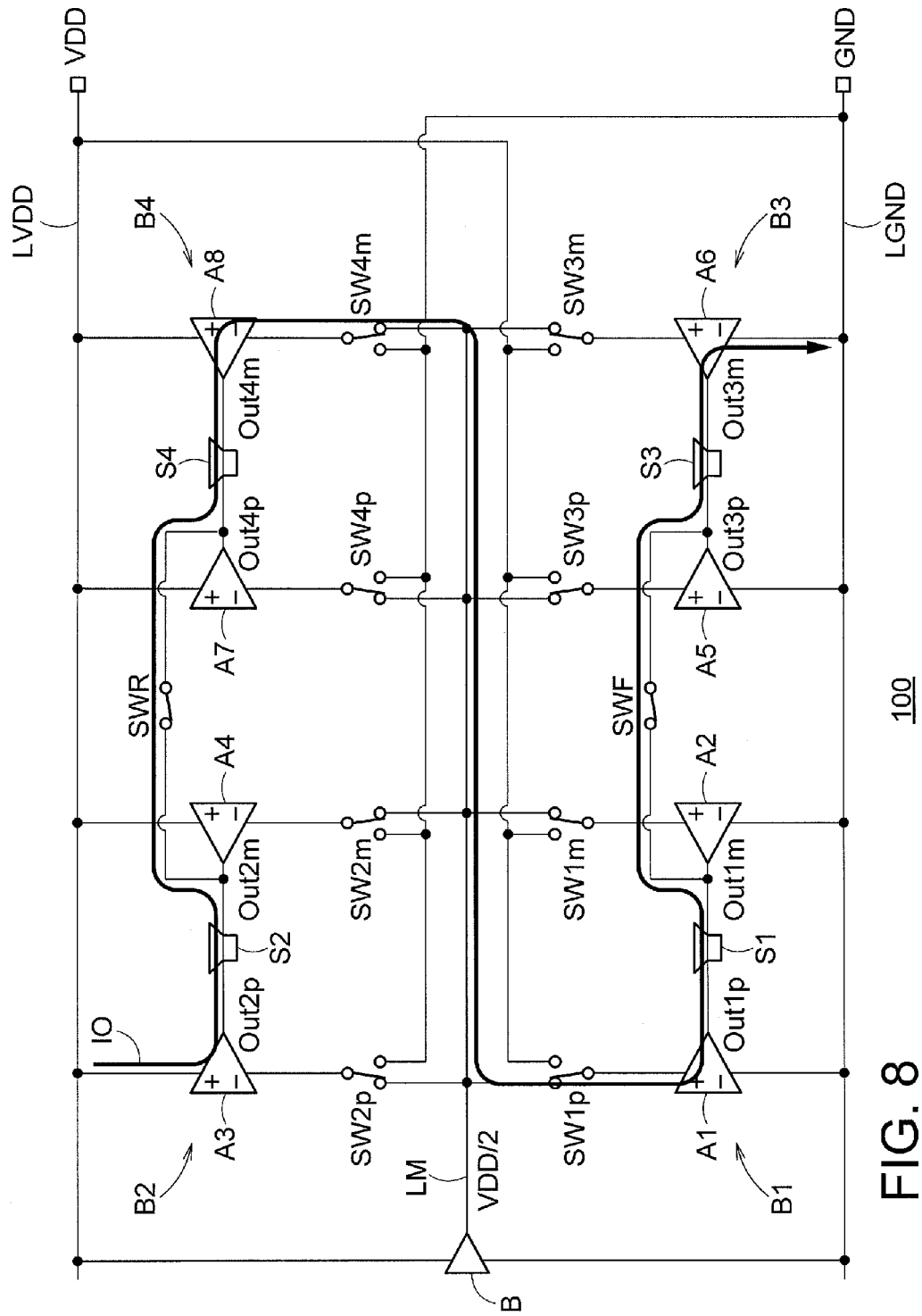
FIG. 8 is a schematic diagram showing a path of the load current in the amplifying device 100 shown in FIG. 1 in a case where the operation mode is the low signal mode, and the signals on the first to fourth channels "ch1" to "ch4" are in phase and have the same amplitude.

FIG. 8 is a schematic diagram showing a path of the load current in the amplifying device 100 shown in FIG. 1 in a case where the operation mode is the low signal mode, and the signals on the first to fourth channels "ch1" to "ch4" are in phase and have the same amplitude. In FIG. 8, for the sake of simplicity, the first to fourth controlling circuits "FBN1" to "FBN4" and the first and second comparators "CF" and "CR" are not shown.

In the example shown in FIG. 8, since the operation mode is the low signal mode, the output signal level is not higher than a fourth of the power supply voltage. And the low potential-side switching circuit "SWF" and the high potential-side switching circuit "SWR" are in the on state.

The switch elements "SW1p", "SW1m", "SW3p" and "SW3m" are switched so that the first and third BTL amplifier units "B1" and "B3" function as BTL amplifier units connected between the third potential line "LM" and the second potential line "LGND".

Furthermore, the switch elements "SW2p", "SW2m", "SW4p" and "SW4m" are switched so that the second and fourth BTL amplifier units "B2" and "B4" function as BTL amplifier units connected between the first potential line "LVDD" and the third potential line "LM".

As shown in FIG. 8, a load current "IO" supplied from the first potential line "LVDD" flows to the third potential line "LM" through the third output amplifier "A3" and the load (speaker "S2") on the second channel "ch2", the high potential-side switching circuit "SWR" and then the load (speaker "S4") on the fourth channel "ch4" and the eighth output amplifier "A8".

The load current "IO" passes through the first output amplifier "A1" and is reused by the load (speaker "S1") on the first channel "ch1", and then passes through the low potential-side switching circuit "SWF" and is reused by the load (speaker "S3") on the third channel "ch3".

That is, the power supply current required to provide a constant power "Po" on each channel is only a fourth of that of the typical B-class amplifying device or AB-class amplifying device. That is, power consumption can be reduced.

Figure 9:
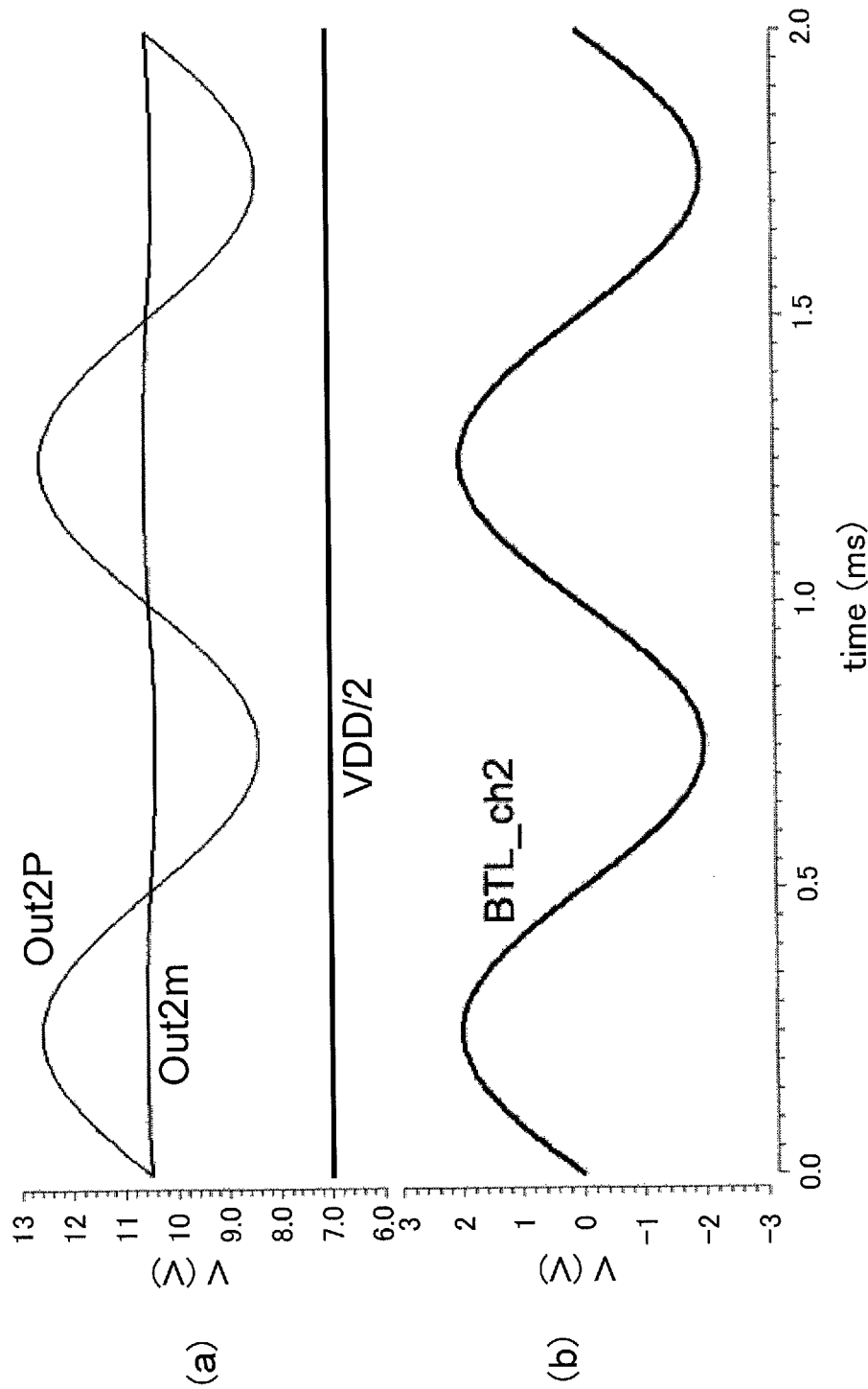
FIG. 9 is a diagram showing examples of the output (a) and the BTL waveform (b) of each output amplifier on the second channel in the low signal mode.
Figure 10:
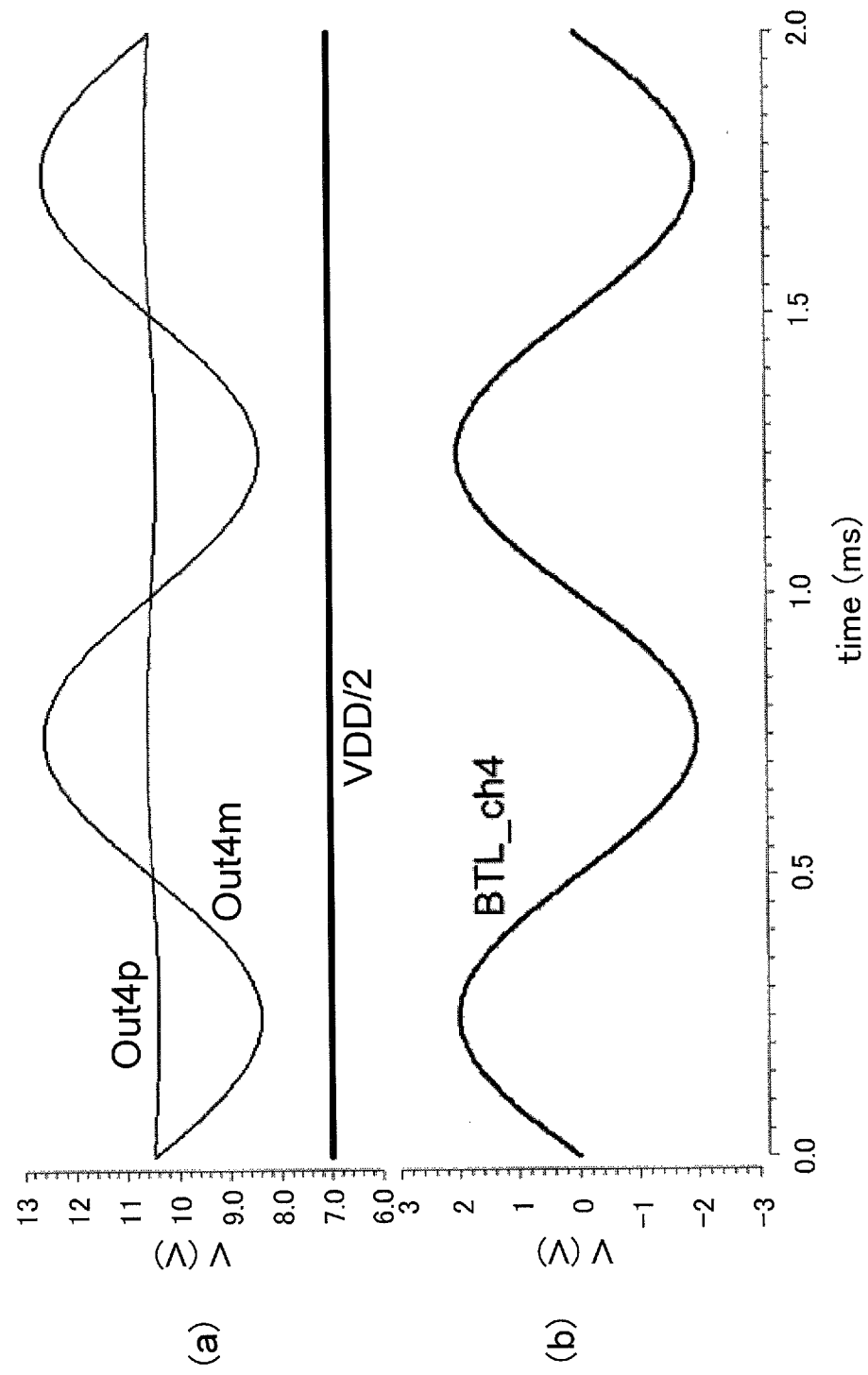
FIG. 10 is a diagram showing examples of the output (a) and the BTL waveform (b) of each output amplifier on the fourth channel in the low signal mode.
Figure 11:
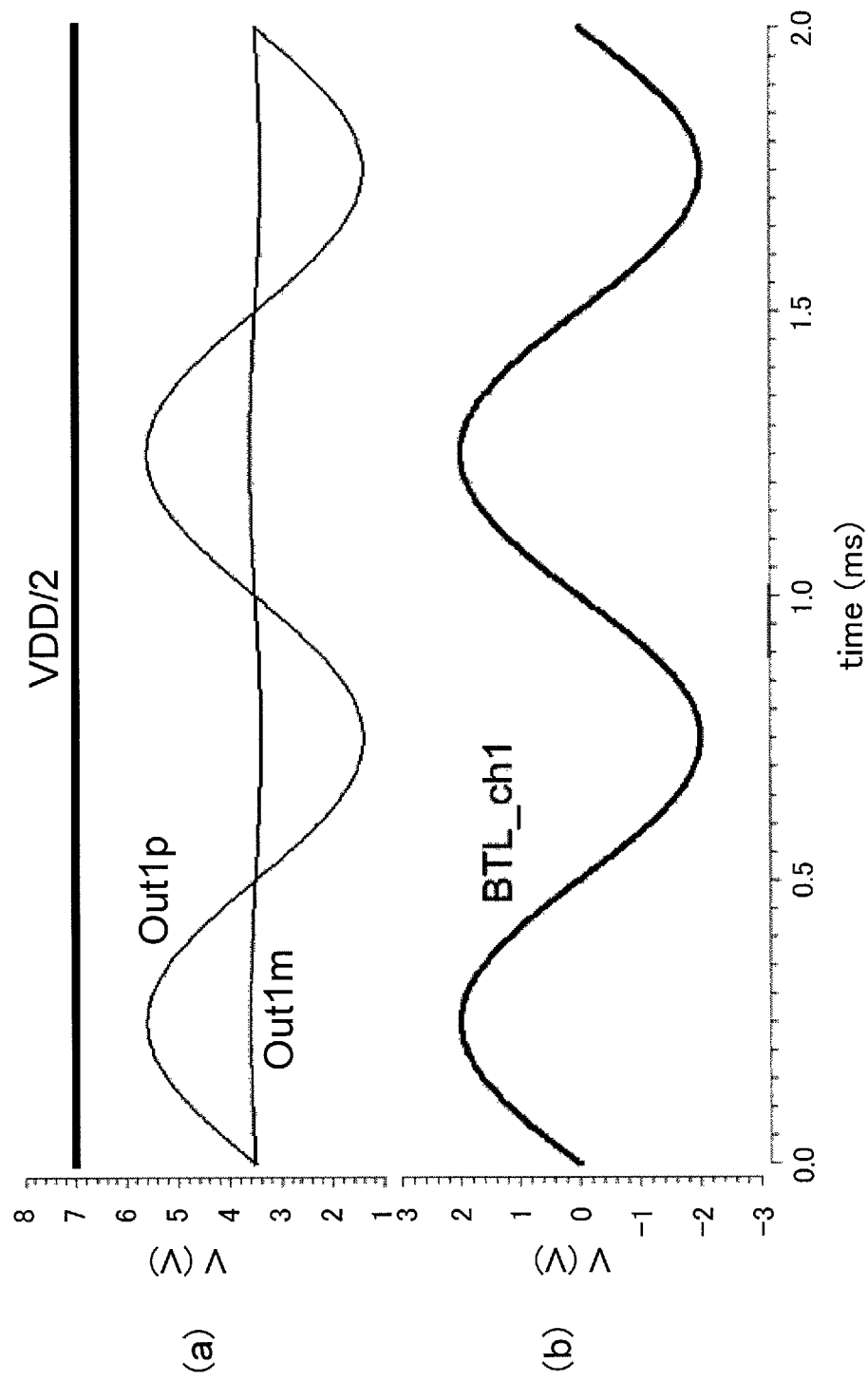
FIG. 11 is a diagram showing examples of the output (a) and the BTL waveform (b) of each output amplifier on the first channel in the low signal mode.
Figure 12:
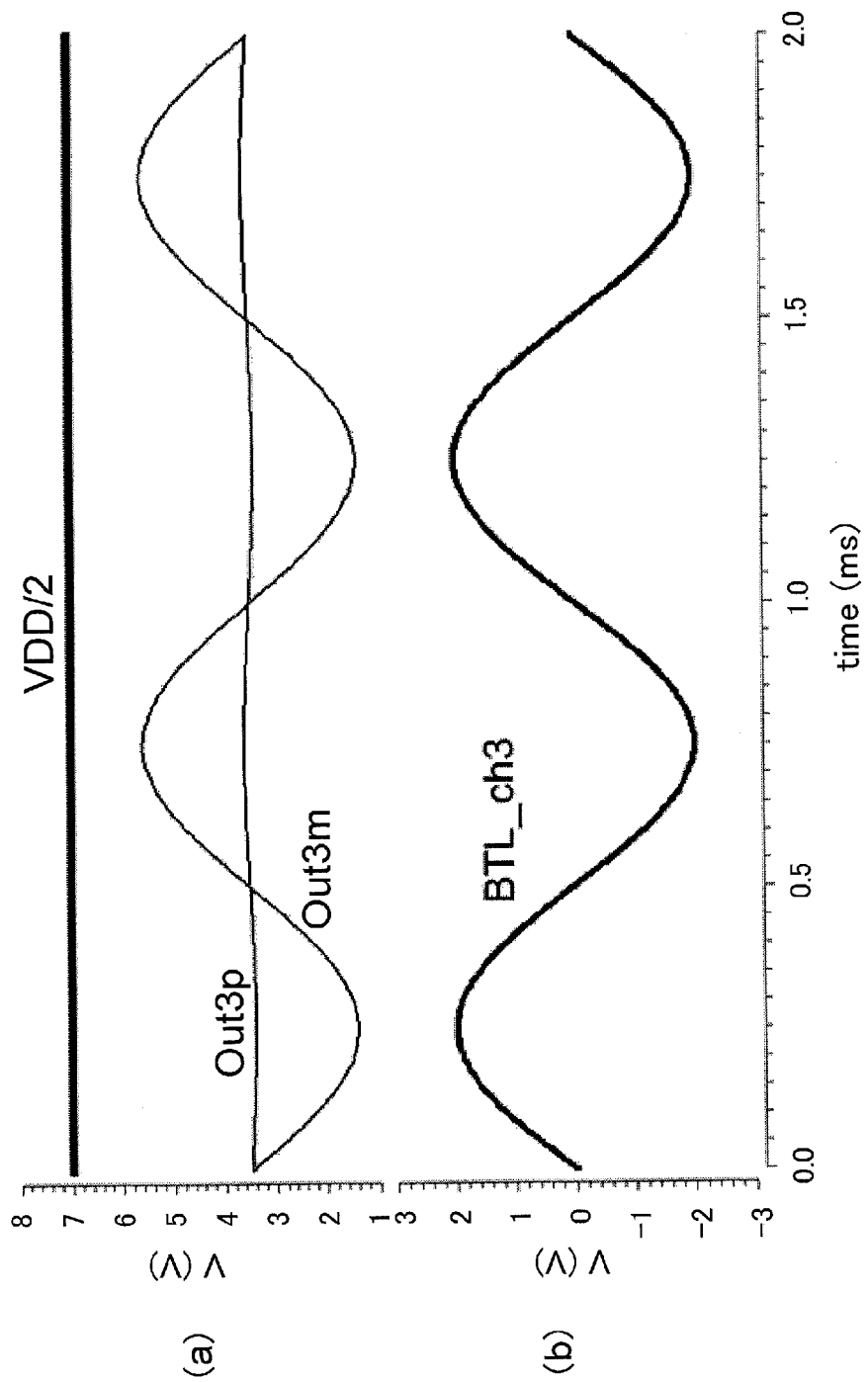
FIG. 12 is a diagram showing examples of the output (a) and the BTL waveform (b) of each output amplifier on the third channel in the low signal mode.

FIG. 9 is a diagram showing examples of the output (a) and the BTL waveform (b) of each output amplifier on the second channel in the low signal mode. FIG. 10 is a diagram showing examples of the output (a) and the BTL waveform (b) of each output amplifier on the fourth channel in the low signal mode. FIG. 11 is a diagram showing examples of the output (a) and the BTL waveform (b) of each output amplifier on the first channel in the low signal mode. FIG. 12 is a diagram showing examples of the output (a) and the BTL waveform (b) of each output amplifier on the third channel in the low signal mode.

As shown in FIGS. 9 and 10, the output voltages "Out2$m$" and "Out4$p$" are fixed at approximately three fourths of the power supply voltage, and the output voltages "Out2$p$" and "Out4$m$" are amplified in response to the input signal.

Since the gain of each BTL amplifier unit is substantially maintained constant, the BTL waveforms on the second channel "ch2" and the fourth channel "ch4" remain sinusoidal.

As shown in FIGS. 11 and 12, the output voltages "Out1$m$" and "Out3$p$" are fixed at approximately a fourth of the power supply voltage, and the output voltages "Out1$p$" and "Out3$m$" are amplified in response to the input signal.

Since the gain of each BTL amplifier unit is substantially maintained constant, the BTL waveforms on the first channel "ch1" and the third channel "ch3" remain sinusoidal.

Figure 13:
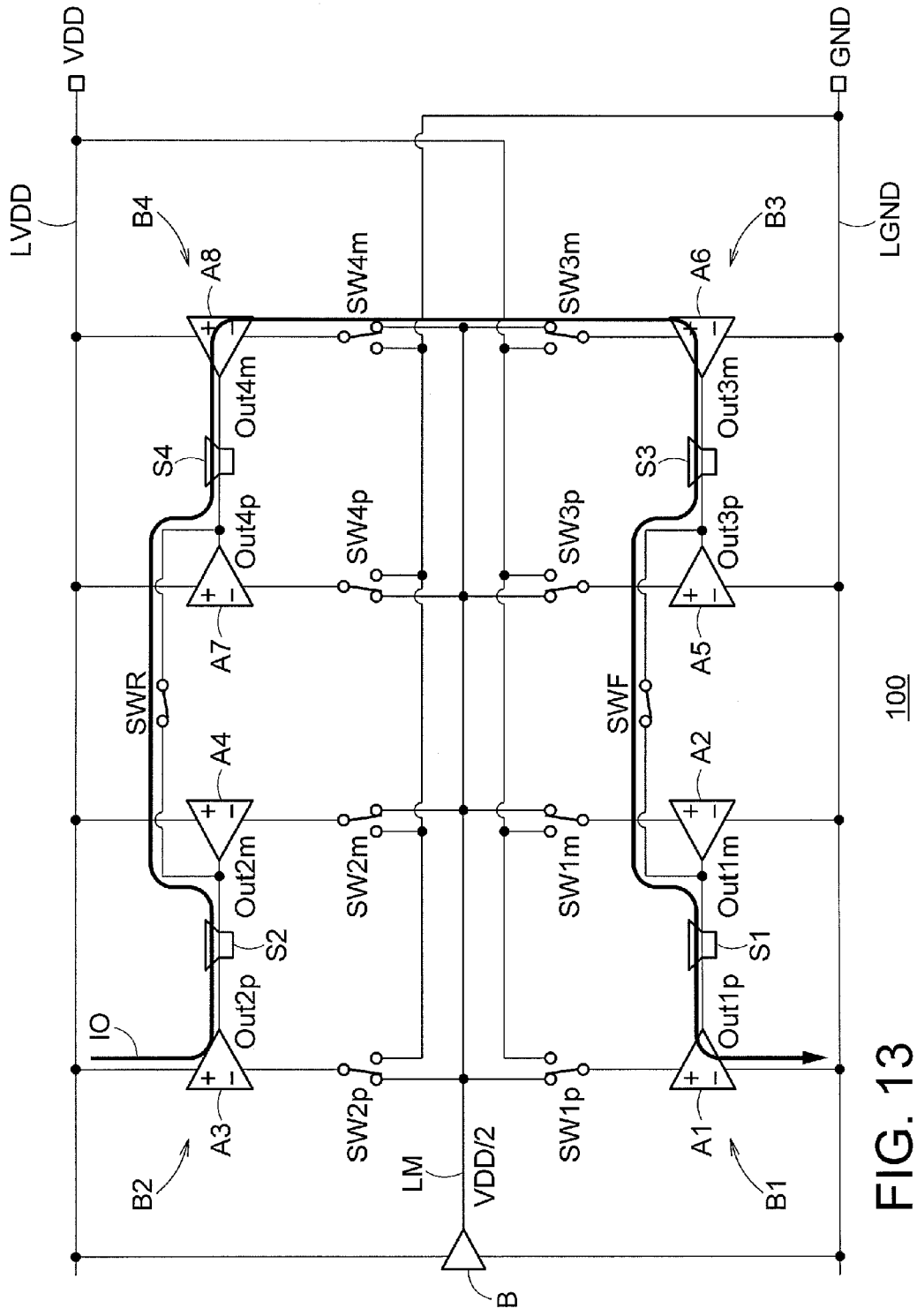
FIG. 13 is a schematic diagram showing a path of the load current in the amplifying device 100 shown in FIG. 1 in a case where the operation mode is the low signal mode, the signals on the first and third channels "ch1" and "ch3" are in opposite phase, and the signals on the second and fourth channels "ch2" and "ch4" are in phase and have the same amplitude.

FIG. 13 is a schematic diagram showing a path of the load current in the amplifying device 100 shown in FIG. 1 in a case where the operation mode is the low signal mode, the signals on the first and third channels "ch1" and "ch3" are in opposite phase, and the signals on the second and fourth channels "ch2" and "ch4" are in phase and have the same amplitude. In FIG. 13, for the sake of simplicity, the first to fourth controlling circuits "FBN1" to "FBN4" and the first and second comparators "CF" and "CR" are not shown.

In the example shown in FIG. 13, since the operation mode is the low signal mode, the output signal level is not higher than a fourth of the power supply voltage. And in the example shown in FIG. 13, the low potential-side switching circuit "SWF" and the high potential-side switching circuit "SWR" are in the on state.

The switch elements "SW1$p$", "SW1$m$", "SW3$p$" and "SW3$m$" are switched so that the first and third BTL amplifier units "B1" and "B3" function as BTL amplifier units connected between the third potential line "LM" and the second potential line "LGND".

Furthermore, the switch elements "SW2$p$", "SW2$m$", "SW4$p$" and "SW4$m$" are switched so that the second and fourth BTL amplifier units "B2" and "B4" function as BTL amplifier units connected between the first potential line "LVDD" and the third potential line "LM".

As shown in FIG. 13, a load current used by the load (speaker "S2") on the second channel "ch2" and the load (speaker "S4") on the fourth channel "ch4" passes through the third potential line "LM" and is reused by the load (speaker "S3") on the third channel "ch3" and then by the load (speaker "S1") on the first channel "ch1".

Whether the signals on the first and third channels "ch1" and "ch3" are in phase with or in opposite phase to the signals on the second and fourth channels "ch2" and "ch4", the load current required to provide the constant power "Po" on each channel is only a fourth of that of the typical B-class amplifying device or AB-class amplifying device. That is, whether the signals on the first and third channels "ch1" and "ch3" are in phase with or in opposite phase to the signals on the second and fourth channels "ch2" and "ch4", power consumption can be reduced.

Figure 14:
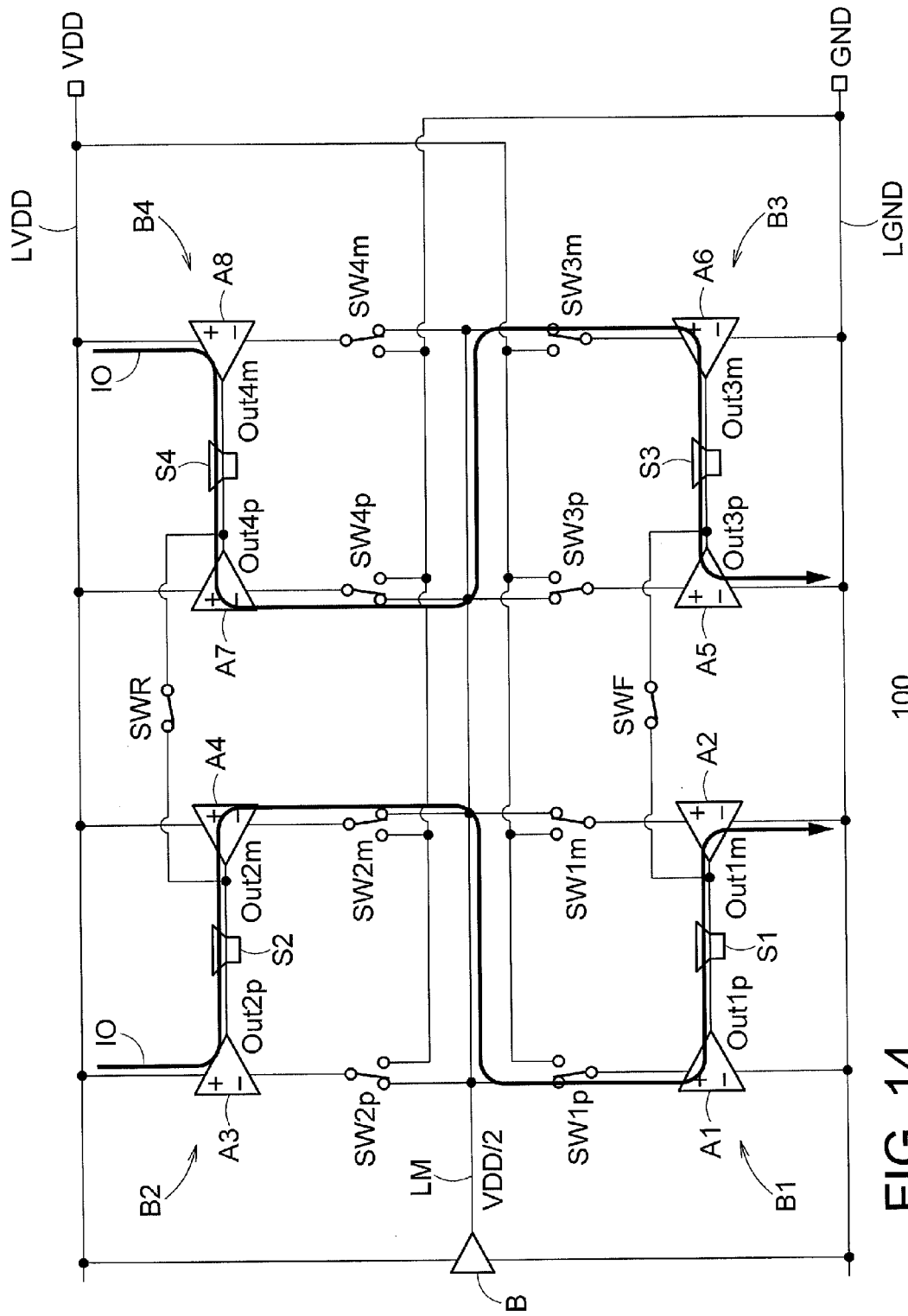
FIG. 14 is a schematic diagram showing paths of load currents in the amplifying device 100 shown in FIG. 1 in a case where the operation mode is the low signal mode, the signals on the first and second channels "ch1" and "ch2" are in phase, and the signals on the third and fourth channels "ch3" and "ch4" are in opposite phase and have the same amplitude.

FIG. 14 is a schematic diagram showing paths of load currents in the amplifying device 100 shown in FIG. 1 in a case where the operation mode is the low signal mode, the signals on the first and second channels "ch1" and "ch2" are in phase, and the signals on the third and fourth channels "ch3" and "ch4" are in opposite phase and have the same amplitude. In FIG. 14, for the sake of simplicity, the first to fourth controlling circuits "FBN1" to "FBN4" and the first and second comparators "CF" and "CR" are not shown.

In the example shown in FIG. 14, since the operation mode is the low signal mode, the output signal level is not higher than a fourth of the power supply voltage. And in the example shown in FIG. 14, the low potential-side switching circuit "SWF" and the high potential-side switching circuit "SWR" are in the on state.

The switch elements "SW1$p$", "SW1$m$", "SW3$p$" and "SW3$m$" are switched so that the first and third BTL amplifier units "B1" and "B3" function as BTL amplifier units connected between the third potential line "LM" and the second potential line "LGND".

Furthermore, the switch elements "SW2$p$", "SW2$m$", "SW4$p$" and "SW4$m$" are switched so that the second and fourth BTL amplifier units "B2" and "B4" function as BTL amplifier units connected between the first potential line "LVDD" and the third potential line "LM".

As shown in FIG. 14, the load currents "IO" on the second and fourth channels "ch2" and "ch4" does not pass through the high potential-side switching circuit "SWR" but flows to the third potential line "LM" and are reused as the load currents "IO" for the first and third channels "ch1" and "ch3", respectively.

The power supply current required to provide the constant power "Po" on each channel is only a half of that of the typical B-class amplifying device or AB-class amplifying device.

Figure 15:
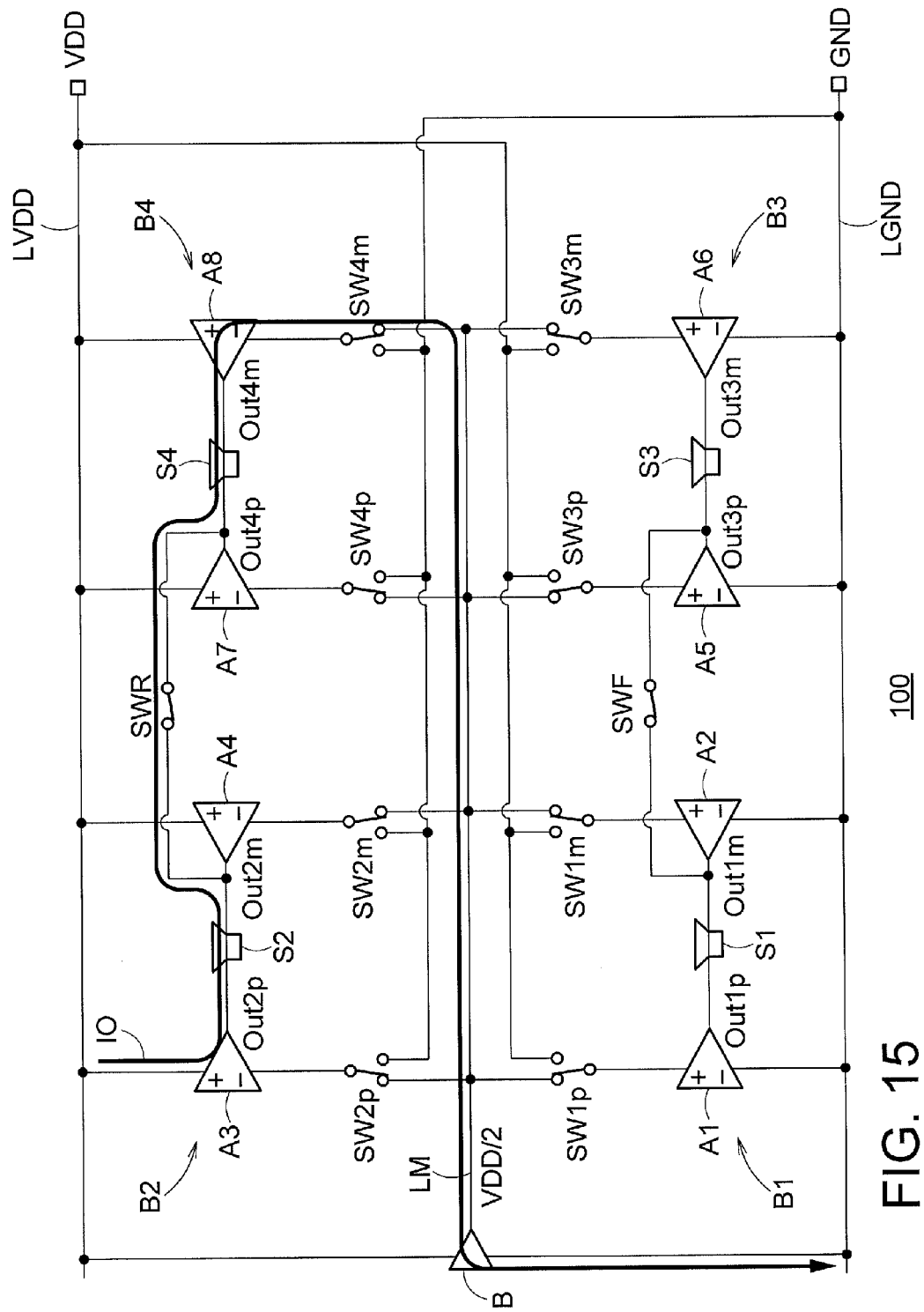
FIG. 15 is a schematic diagram showing a path of the load current in the amplifying device 100 shown in FIG. 1 in a case where the operation mode is the low signal mode, the signals on the first and third channels "ch1" and "ch3" are null, and the signals on the second and fourth channels "ch2" and "ch4" are in phase and have the same amplitude.

FIG. 15 is a schematic diagram showing a path of the load current in the amplifying device 100 shown in FIG. 1 in a case where the operation mode is the low signal mode, the signals on the first and third channels "ch1" and "ch3" are null, and the signals on the second and fourth channels "ch2" and "ch4" are in phase and have the same amplitude. In FIG. 15, for the sake of simplicity, the first to fourth controlling circuits "FBN1" to "FBN4" and the first and second comparators "CF" and "CR" are not shown.

In the example shown in FIG. 15, since the operation mode is the low signal mode, the output signal level is not higher than a fourth of the power supply voltage. And in the example shown in FIG. 15, the low potential-side switching circuit "SWF" and the high potential-side switching circuit "SWR" are in the on state.

As shown in FIG. 15, the load current "IO" used by the loads (speakers "S2" and "S4") on the second and fourth channels "ch2" and "ch4" flows to a buffer amplifier through the third potential line "LM".

Since the signals on the first and third channels "ch1" and "ch3" are null, no load current "IO" flows to the loads (speakers "S1" and "S3") on the first and third channels "ch1" and "ch3".

Figure 16:
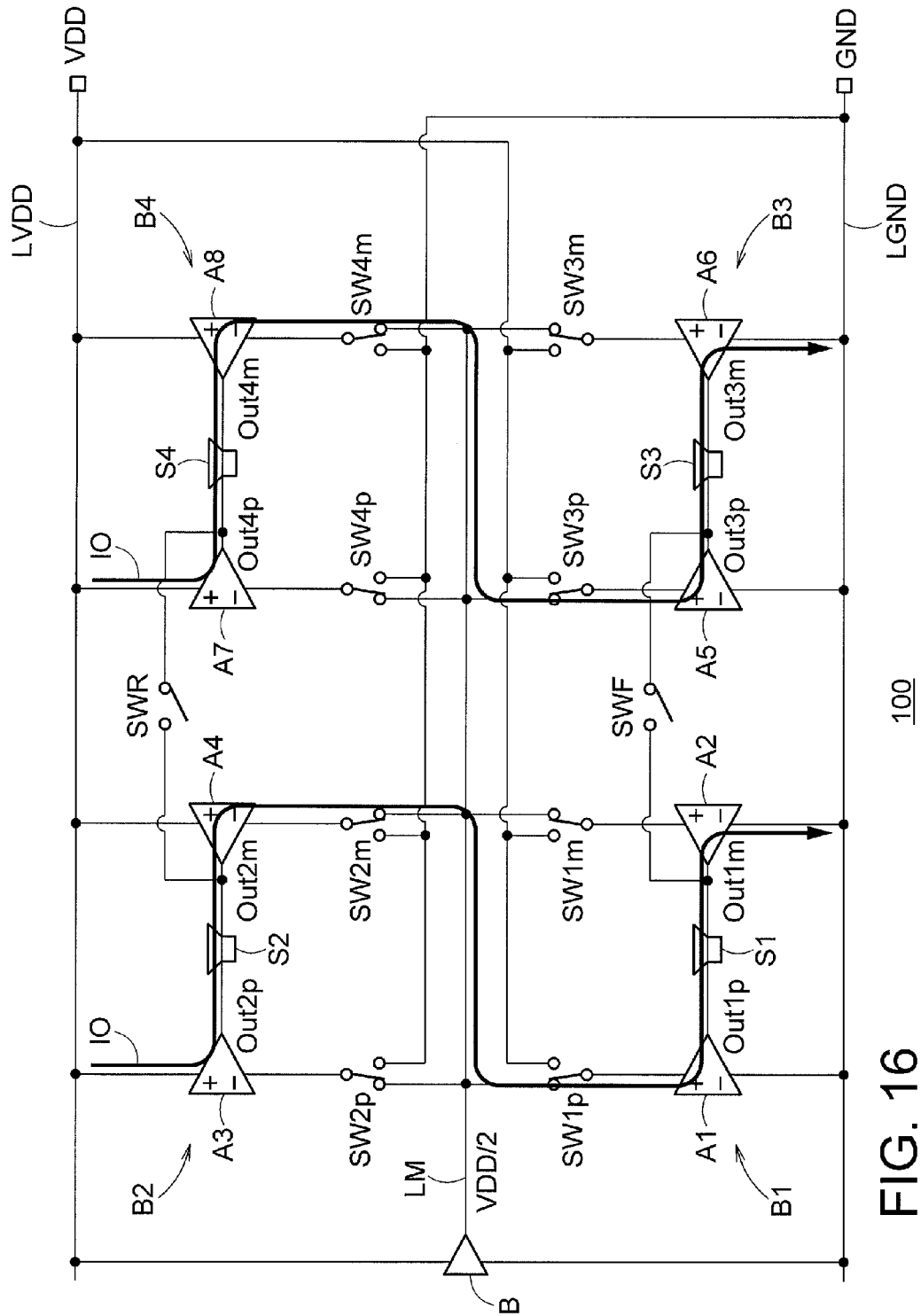
FIG. 16 is a schematic diagram showing paths of load currents in the amplifying device 100 shown in FIG. 1 in a case where the operation mode is the medium signal mode, the signals on the first to fourth channels "ch1" to "ch4" are in phase and have the same amplitude.

FIG. 16 is a schematic diagram showing paths of load currents in the amplifying device 100 shown in FIG. 1 in a case where the operation mode is the medium signal mode, the signals on the first to fourth channels "ch1" to "ch4" are in phase and have the same amplitude. In FIG. 16, for the sake of simplicity, the first to fourth controlling circuits "FBN1" to "FBN4" and the first and second comparators "CF" and "CR" are not shown.

In the example shown in FIG. 16, since the operation mode is the medium signal mode, the output signal level is not higher than a half of the power supply voltage. And in the example shown in FIG. 16, the low potential-side switching circuit "SWF" and the high potential-side switching circuit "SWR" are in the off state.

The switch elements "SW1$p$", "SW1$m$", "SW3$p$" and "SW3$m$" are switched so that the first and third BTL amplifier units "B1" and "B3" function as BTL amplifier units connected between the third potential line "LM" and the second potential line "LGND".

Furthermore, the switch elements "SW2p", "SW2m", "SW4p" and "SW4m" are switched so that the second and fourth BTL amplifier units "B2" and "B4" function as BTL amplifier units connected between the first potential line "LVDD" and the third potential line "LM".

As shown in FIG. 16, the load currents "IO" on the second and fourth channels "ch2" and "ch4" do not pass through the high potential-side switching circuit "SWR" but flows to the third potential line "LM" and are reused as the load currents "IO" for the first and third channels "ch1" and "ch3", respectively.

The load current to provide the required power "Po" in each amplifier unit is twice as high as the load current "IO".

The power supply current required to provide the constant power "Po" on each channel is only a half of that of the typical B-class amplifying device or AB-class amplifying device.

Figure 17:
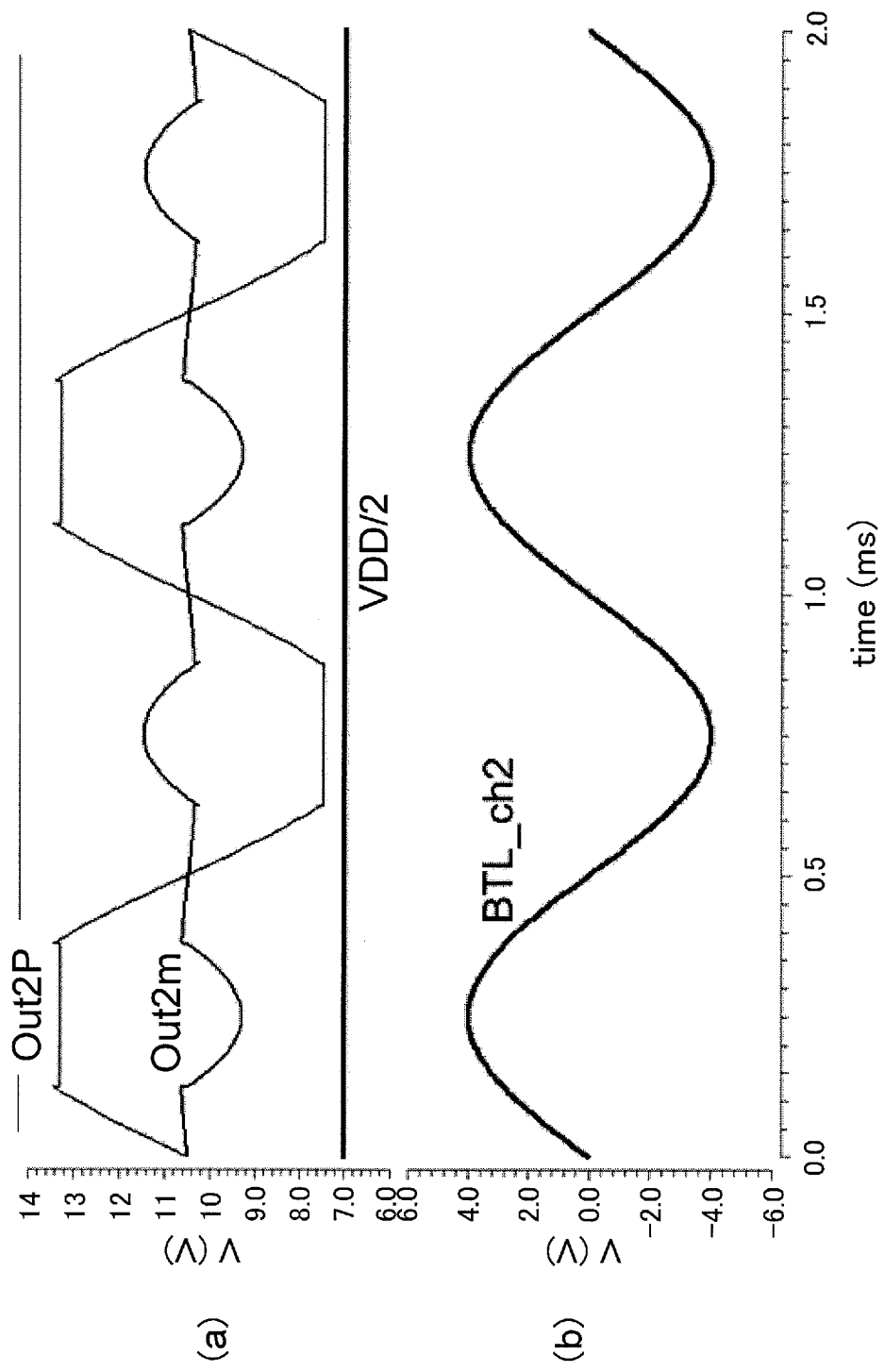
FIG. 17 is a diagram showing examples of the output (a) and the BTL waveform (b) of each output amplifier on the second channel in the low signal mode and the medium signal mode.
Figure 18:
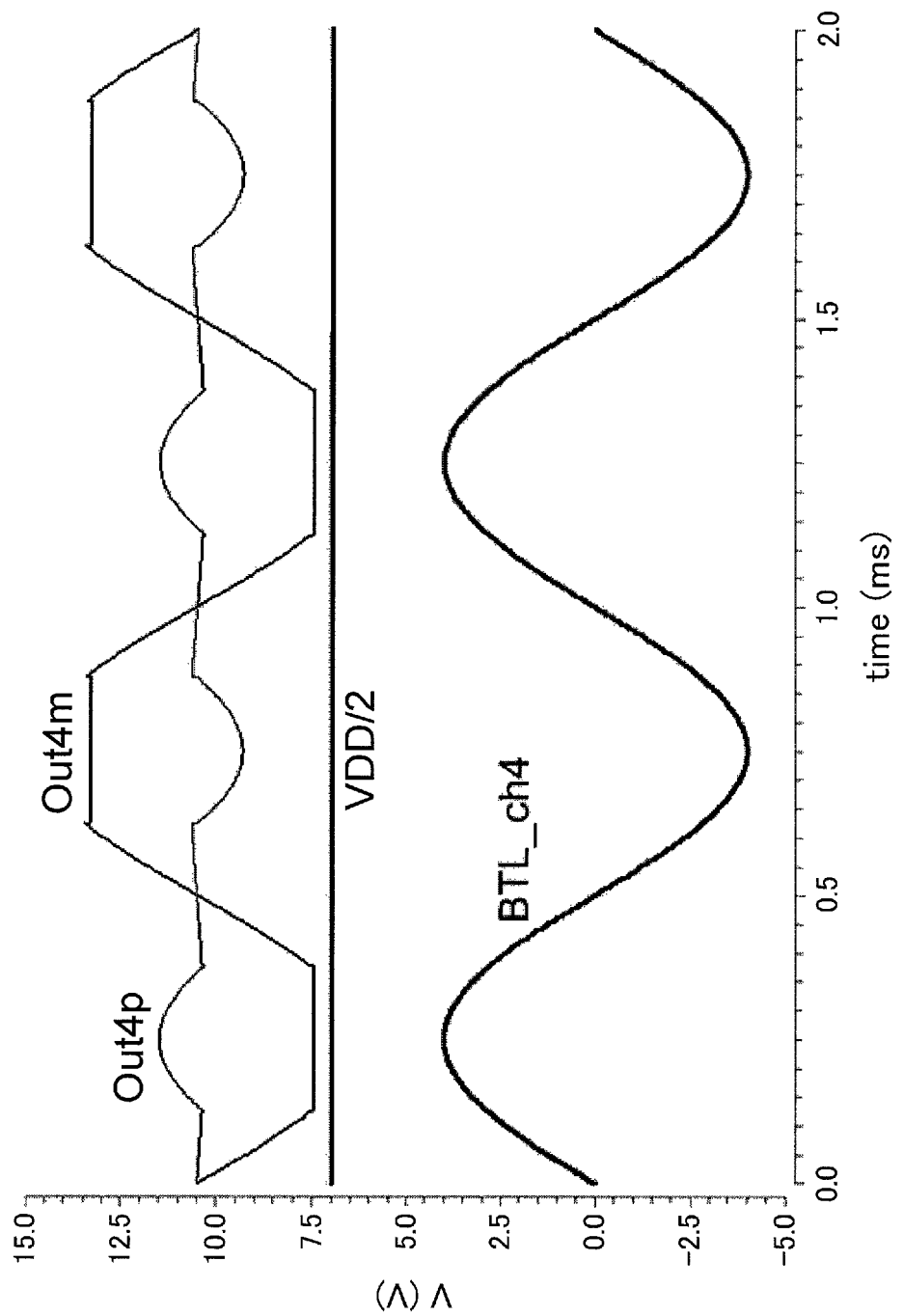
FIG. 18 is a diagram showing examples of the output (a) and the BTL waveform (b) of each output amplifier on the fourth channel in the low signal mode and the medium signal mode.
Figure 19:
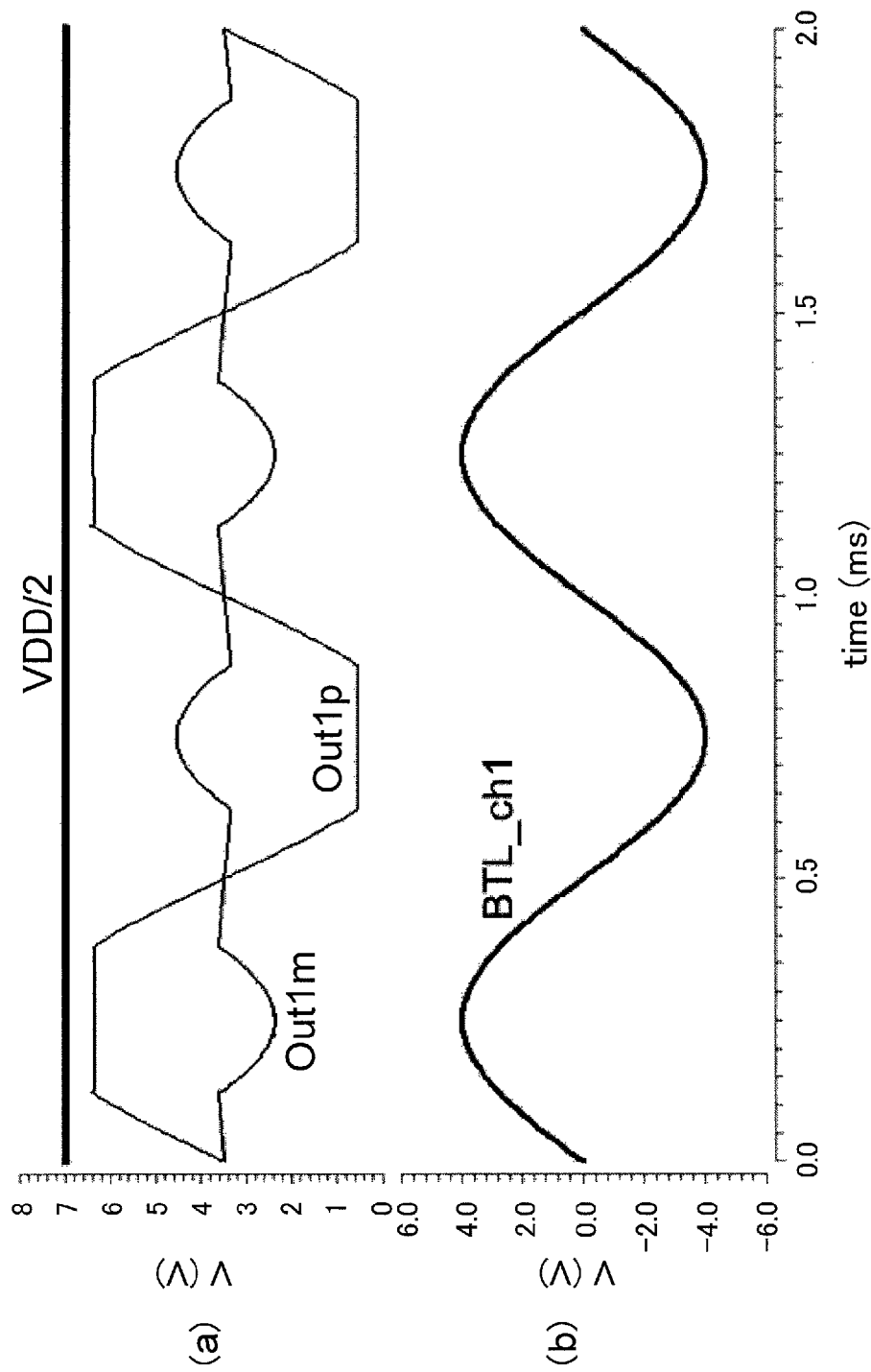
FIG. 19 is a diagram showing examples of the output (a) and the BTL waveform (b) of each output amplifier on the first channel in the low signal mode and the medium signal mode.
Figure 20:
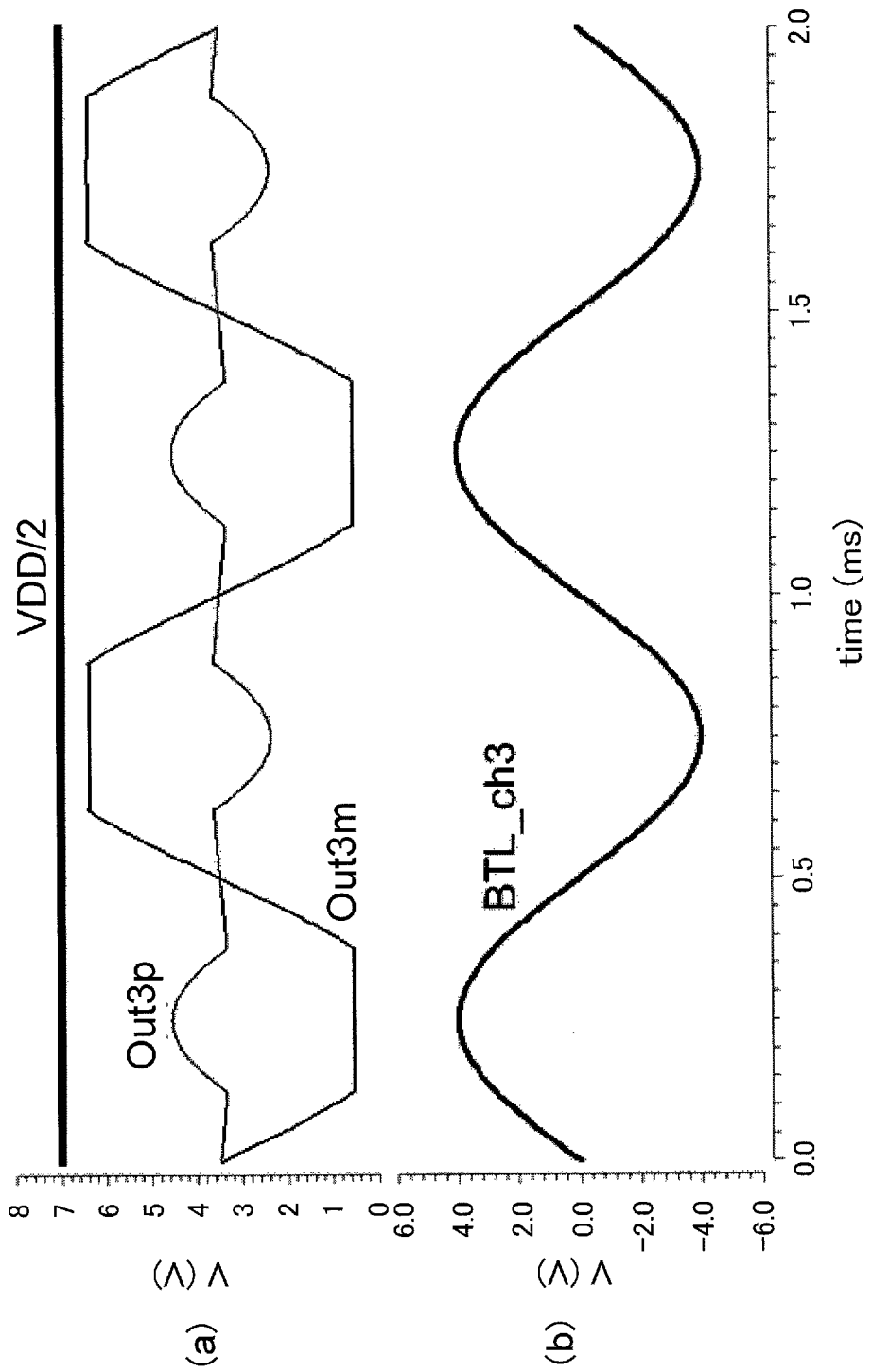
FIG. 20 is a diagram showing examples of the output (a) and the BTL waveform (b) of each output amplifier on the third channel in the low signal mode and the medium signal mode.

FIG. 17 is a diagram showing examples of the output (a) and the BTL waveform (b) of each output amplifier on the second channel in the low signal mode and the medium signal mode. FIG. 18 is a diagram showing examples of the output (a) and the BTL waveform (b) of each output amplifier on the fourth channel in the low signal mode and the medium signal mode. FIG. 19 is a diagram showing examples of the output (a) and the BTL waveform (b) of each output amplifier on the first channel in the low signal mode and the medium signal mode. FIG. 20 is a diagram showing examples of the output (a) and the BTL waveform (b) of each output amplifier on the third channel in the low signal mode and the medium signal mode.

As shown in FIGS. 17 and 18, the output voltages "Out2m" and "Out4p" are in the low signal mode in the period in which the output voltages "Out2m" and "Out4p" are fixed at approximately three fourths of the power supply voltage. However, the signal level then further increases, and the output voltages "Out2m" and "Out4p" are in the medium signal mode in the period in which the output voltages "Out2p" and "Out4m" are held at the value immediately before switching from the low signal mode to the medium signal mode occurs.

Note that the output voltages "Out2p" and "Out4m" at the point of switching are set not to exceed a half of the power supply voltage, which is the intermediate potential (third potential).

In the medium signal mode, the output voltages "Out2p" and "Out4m" are fixed, while the gains of the BTL amplifier units are maintained substantially constant. However, an amplitude occurs in the output voltages "Out2m" and "Out4p", and the BTL waveforms on the second channel "ch2" and the fourth channel "ch4" remain sinusoidal.

As shown in FIGS. 19 and 20, the output voltages "Out1m" and "Out3p" are in the low signal mode in the period in which the output voltages "Out1m" and "Out3p" are fixed at approximately a fourth of the power supply voltage. However, the signal level then further increases, and the output voltages "Out1m" and "Out3p" are in the medium signal mode in the period in which the output voltages "Out1p" and "Out3m" are held at the value immediately before switching from the low signal mode to the medium signal mode occurs.

Note that the output voltages "Out1p" and "Out3m" at the point of switching are set not to exceed a half of the power supply voltage, which is the intermediate potential (third potential).

In the medium signal mode, the output voltages "Out1p" and "Out3m" are fixed, while the gains of the BTL amplifier units are maintained substantially constant. However, an amplitude occurs in the output voltages "Out1m" and "Out3p", and the BTL waveforms on the first channel "ch1" and the third channel "ch3" remain sinusoidal.

Figure 21:
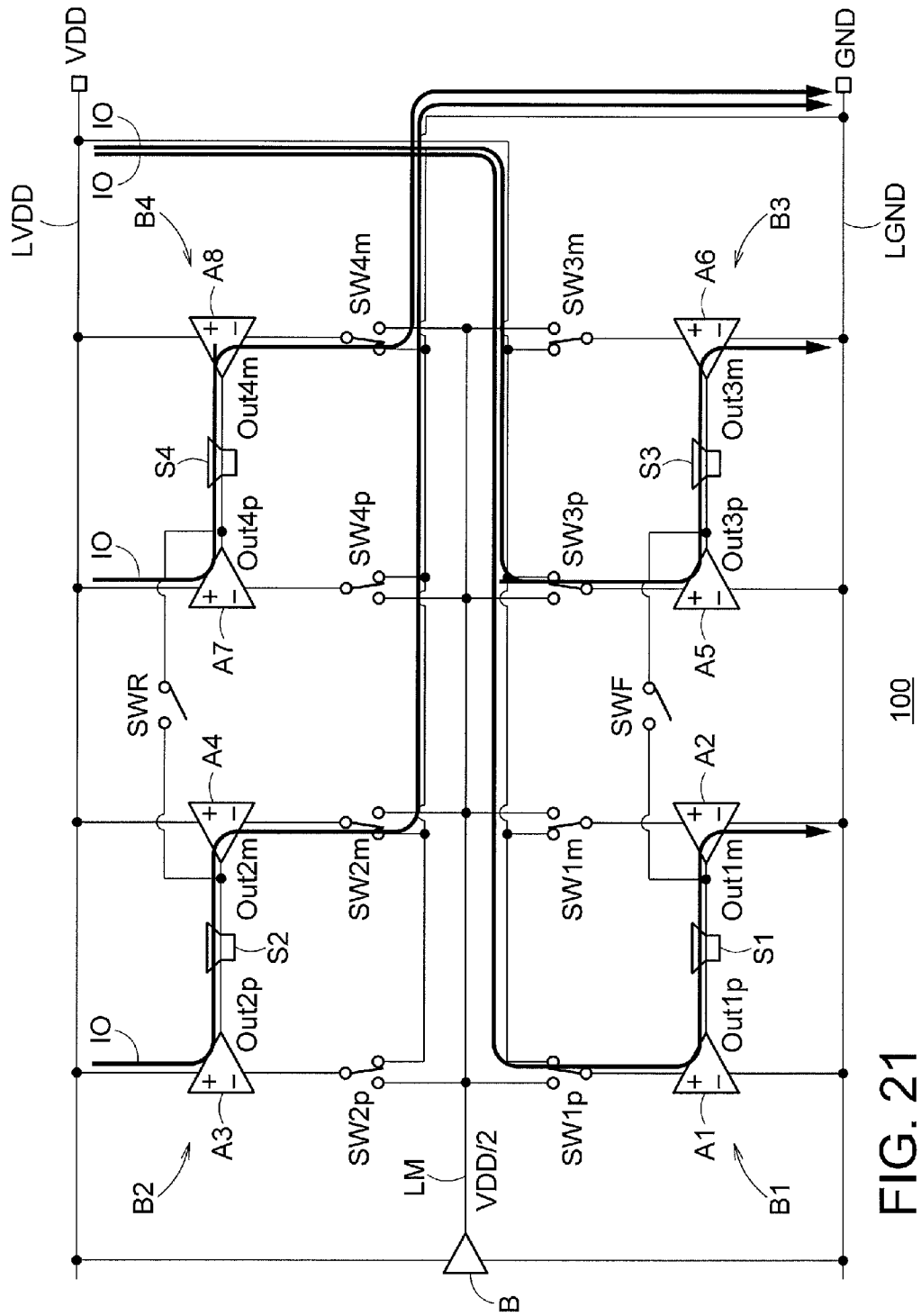
FIG. 21 is a schematic diagram showing paths of load currents in the amplifying device 100 shown in FIG. 1 in a case where the operation mode is the high signal mode.

FIG. 21 is a schematic diagram showing paths of load currents in the amplifying device 100 shown in FIG. 1 in a case where the operation mode is the high signal mode. In FIG. 21, for the sake of simplicity, the first to fourth controlling circuits "FBN1" to "FBN4" and the first and second comparators "CF" and "CR" are not shown.

In the high signal mode, the low potential-side switching circuit "SWF" and the high potential-side switching circuit "SWR" are in the off state, the switch elements "SW1p", "SW1m", "SW3p" and "SW3m" are connected to the first potential line "LVDD", and the switch elements "SW2p", "SW2m", "SW4p" and "SW4m" are connected to the second potential line "LGND". That is, the first to fourth BTL amplifier units "B1" to "B4" are BTL amplifier units connected between the first potential line "LVDD" and the second potential line "LGND". Therefore, a high output power can be obtained.

However, the load current supplied from the first potential line "LVDD" in order to provide the output power "Po" on each BTL amplifier unit needs to be four times as high as the load current "IO", as with the typical B-class amplifying device or AB-class amplifying device.

Figure 22:
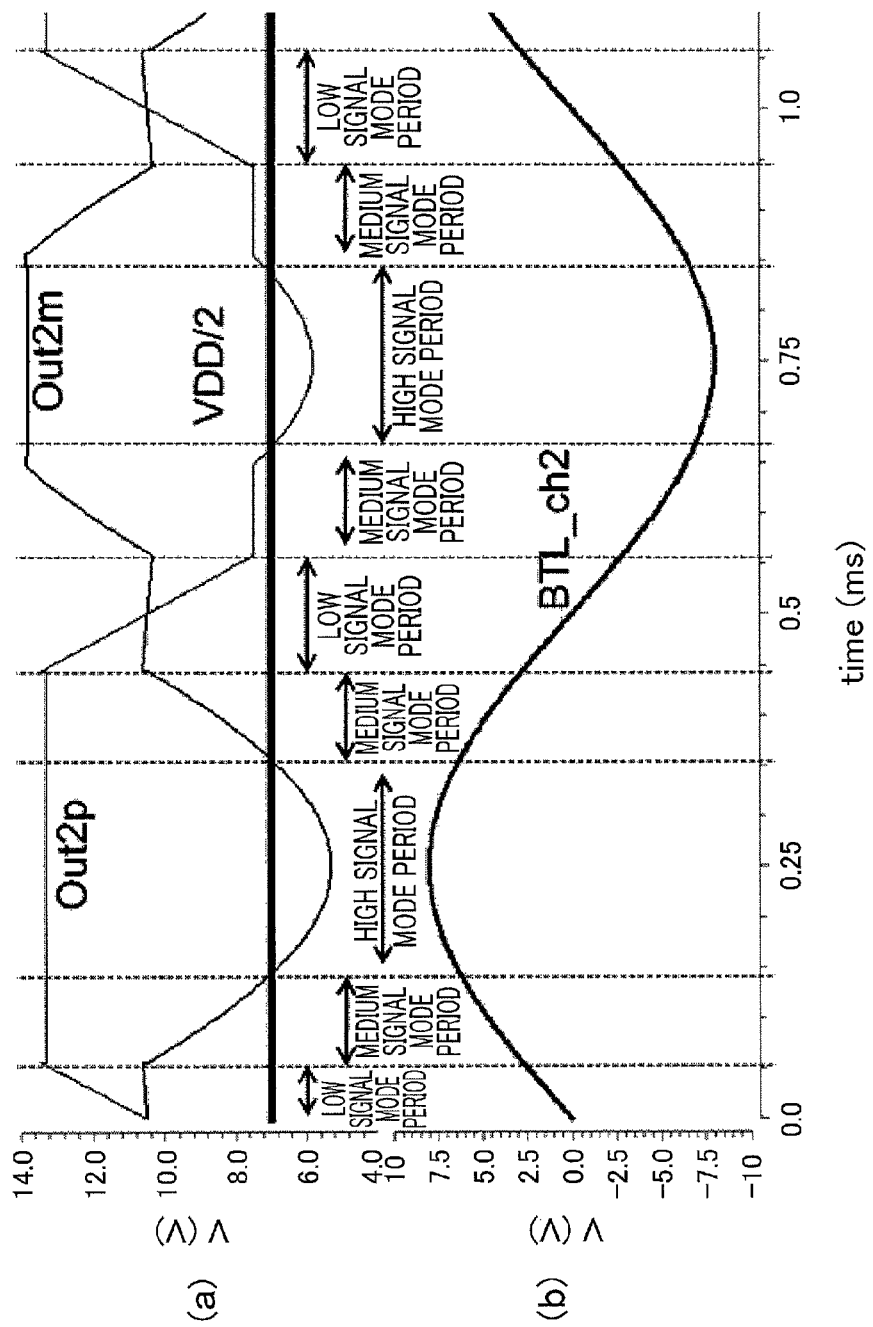
FIG. 22 is a diagram showing examples of the output (a) and the BTL waveform (b) of each output amplifier on the second channel "ch2" in the operation modes from the low signal mode to the high signal mode.

FIG. 22 is a diagram showing examples of the output (a) and the BTL waveform (b) of each output amplifier on the second channel "ch2" in the operation modes from the low signal mode to the high signal mode.

Although FIG. 22 shows the second channel "ch2" as an example, the loss in the high signal mode is also reduced compared with the AB-class or KB-class amplifying device, since the low signal mode, the medium signal mode and the high signal mode repeatedly occur in one cycle of a sinusoidal wave.

In FIG. 22, the operation mode in the period in which the output voltage "Out2m" is fixed at approximately three fourths of the power supply voltage is the low signal mode. The signal level then increases, and the operation mode in the period in which the output voltage "Out2p" is held at the value immediately before switching from the low signal mode to the medium signal mode occurs is the medium signal mode.

The output voltages "Out2p" and "Out2m" at the point of switching are set not to exceed the intermediate potential (third potential) "VDD/2".

The signal level then further increases, and the operation mode in the period in which the level of the output voltage "Out2m" or "Out2p" exceeds the intermediate potential (third potential) "VDD/2" is the high signal mode. As the operation mode changes from the low signal mode to the intermediate mode and from the intermediate mode to the high signal mode, the gains of the BTL amplifier units are substantially maintained constant, so that the BTL waveform on the second channel "ch2" remains sinusoidal.

Figure 23:
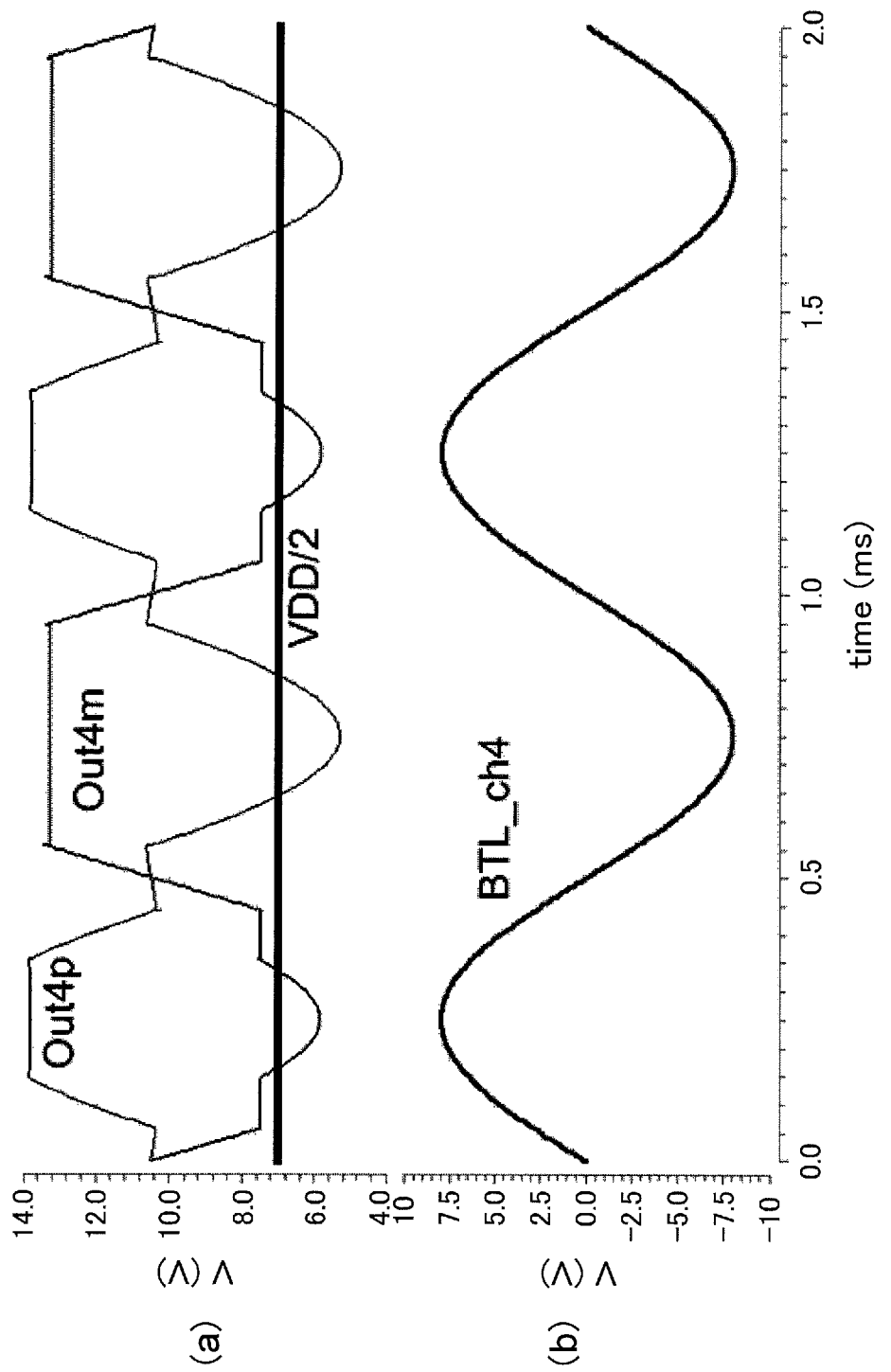
FIG. 23 is a diagram showing examples of the output (a) and the BTL waveform (b) of each output amplifier on the fourth channel "ch4" in the operations modes from the low signal mode to the high signal mode.
Figure 24:
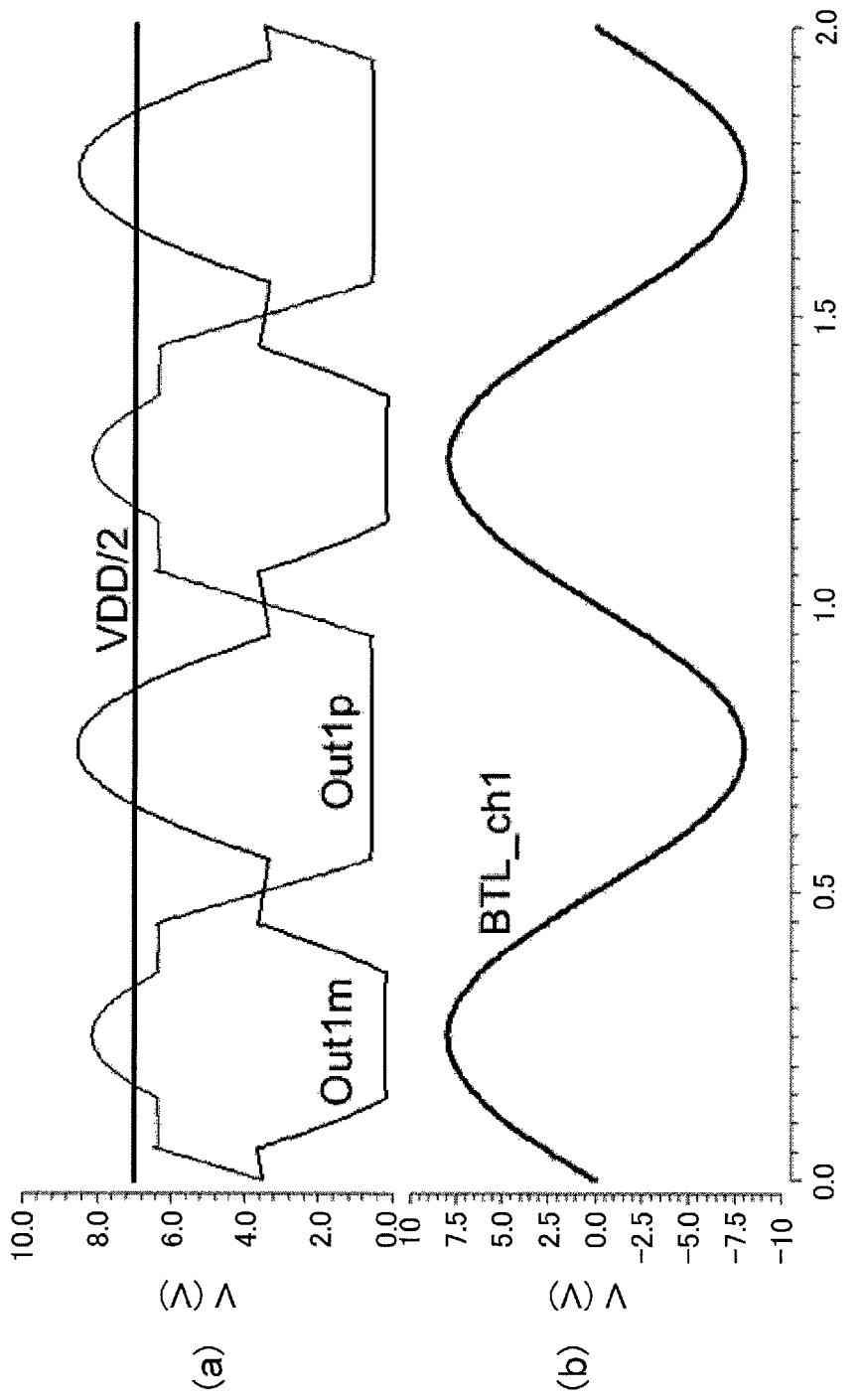
FIG. 24 is a diagram showing examples of the output (a) and the BTL waveform (b) of each output amplifier on the first channel "ch1" in the operation modes from the low signal mode to the high signal mode.
Figure 25:
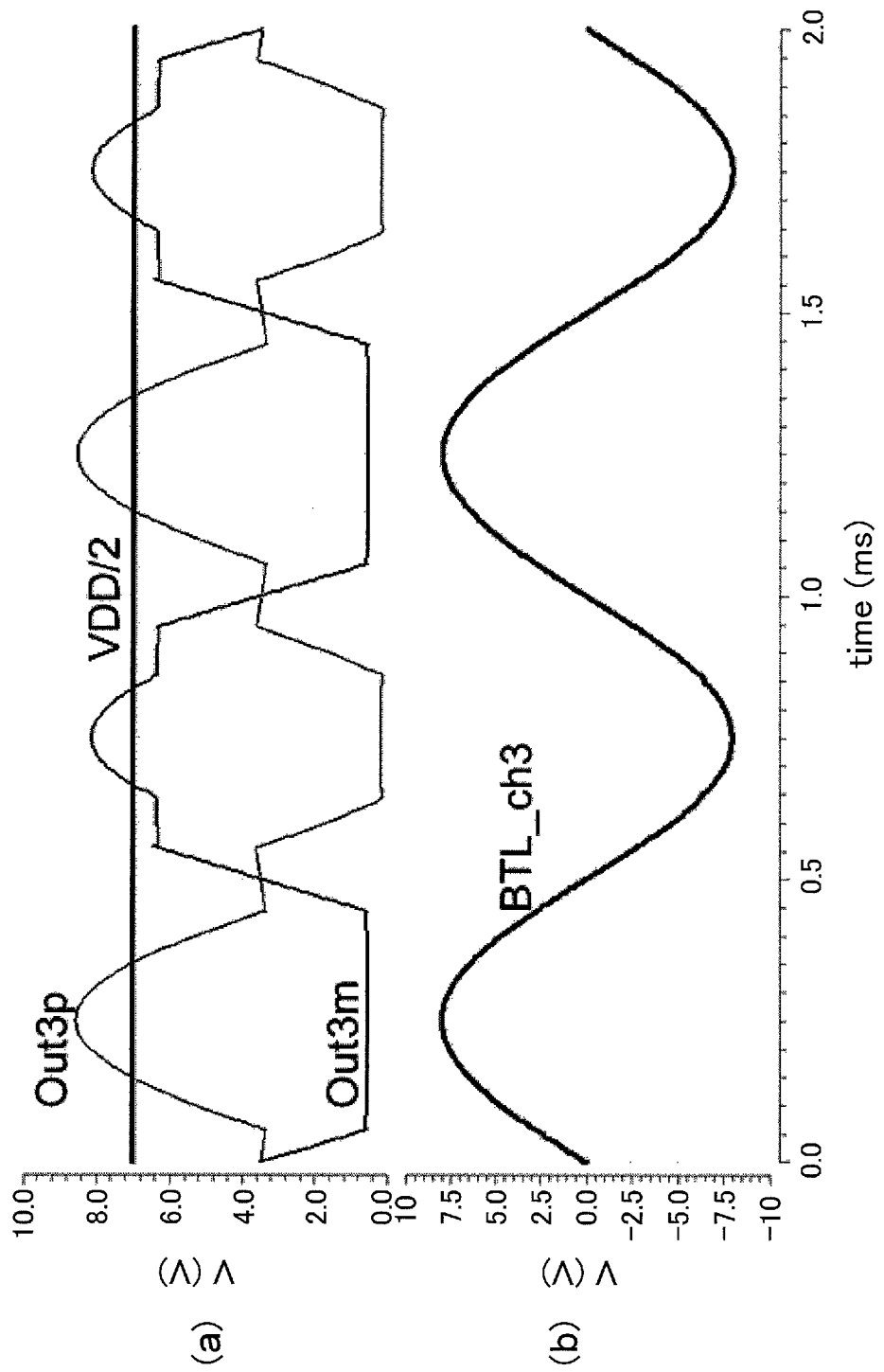
FIG. 25 is a diagram showing examples of the output (a) and the BTL waveform (b) of each output amplifier on the third channel "ch3" in the operation modes from the low signal mode to the high signal mode.

FIG. 23 is a diagram showing examples of the output (a) and the BTL waveform (b) of each output amplifier on the fourth channel "ch4" in the operations modes from the low signal mode to the high signal mode. FIG. 24 is a diagram showing examples of the output (a) and the BTL waveform (b) of each output amplifier on the first channel "ch1" in the operation modes from the low signal mode to the high signal mode. FIG. 25 is a diagram showing examples of the output (a) and the BTL waveform (b) of each output amplifier on the third channel "ch3" in the operation modes from the low signal mode to the high signal mode.

The outputs (a) and the BTL waveforms (b) of the output amplifier units on the first to fourth channels "ch1" to "ch4" in the operation mode from the low signal mode to the high signal mode shown in FIGS. 22 to 25 can be described in the same manner as with FIG. 22.

As described above, in the four-channel power amplifying device (power amplifier) 100, the two BTL amplifier units "B2" and "B4" whose output amplifiers are connected between the first potential line "LVDD" and the third potential line "LM" in the low signal mode reuse the current consumed for driving the loads during an in-phase input signal, and the two BTL amplifier units "B1" and "B3" whose output amplifiers are connected between the third potential line "LM" and the second potential line "LGND" also reuse the current consumed for driving the loads during an in-phase input signal.

Since the upper two BTL amplifier units "B2" and "B4" and the lower two BTL amplifier units "B1" and "B3" are connected to the third potential line "LM", the load current consumed by the upper two BTL amplifier units "B2" and "B4" passes through the third potential line "LM" and is consumed by the lower two BTL amplifier units "B1" and "B3". Thus, the load current is used among all of the four BTL amplifier units.

That is, the current consumed for driving the loads is only a fourth of that of the conventional B-class amplifying device.

When the input signal level increases, and the medium signal mode is entered, the upper two BTL amplifier units are separated, and the lower two BTL amplifier units "B1" and "B3" are separated, but the BTL amplifier units are connected to the third potential line "LM". Therefore, the load current consumed by the upper two BTL amplifier units "B2" and "B4" passes through the third potential line "LM" and is consumed by the lower two BTL amplifier units. Thus, of the four BTL amplifier units "B1" to "B4", each of pairs of BTL amplifier units uses the load current.

That is, the current consumed for driving the loads is only a half of that of the conventional B-class amplifying device.

When the signal level further increases, and the high signal mode is entered, the BTL amplifier units "B1" to "B4" on all the channels are BTL amplifier unit connected between the first potential line "LVDD" and the second potential line "LGND", and a high maximum power can be achieved, while the current consumed for driving the loads are comparable to that of the conventional B-class amplifying device.

As described above, the power amplifying device (referred to as a power amplifying device of the Tied B-class (TB-class) amplification type) 100 according to this embodiment switches the connection of the bridge output stage in response to the signal level. In an application to a four-channel power amplifier, the consumed power in the low signal mode is a fourth of that of the conventional B-class amplifying device, the consumed power in the medium signal mode is a half of that of the conventional B-class amplifying device, and the consumed power in the high signal mode is comparable to that of the conventional B-class amplifying device.

In particular, the power amplifying device 100 according to this embodiment can be considered as a high-efficiency analog power amplifier that poses no problem of unwanted radiation.

Figure 26:
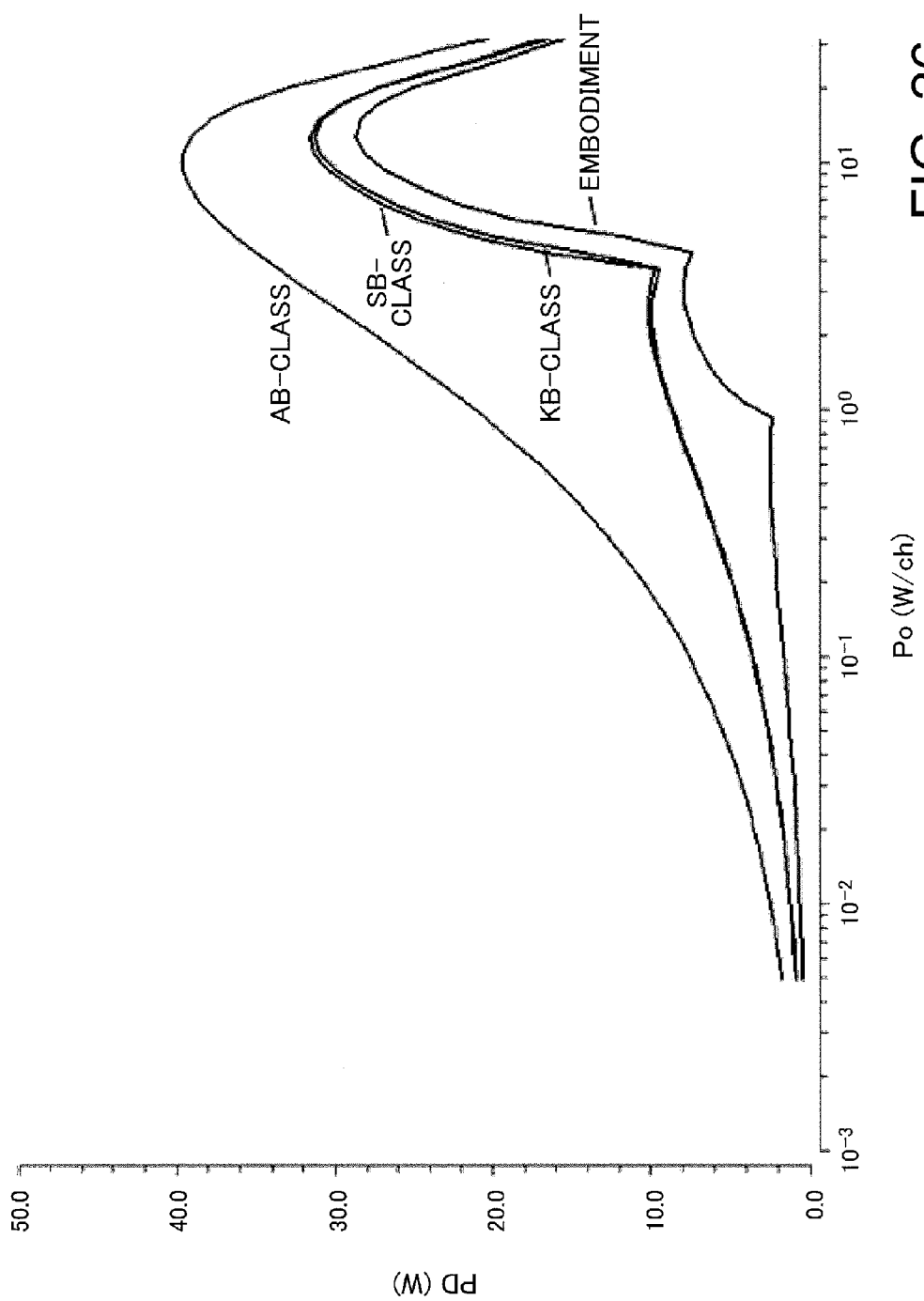
FIG. 26 is a diagram showing an example of a result of simulation of the power loss and output power of different power amplifiers.

FIG. 26 is a diagram showing an example of a result of simulation of the power loss and output power of different power amplifiers.

FIG. 26 shows the power loss with respect to the output power of the conventional AB-class (B-class), KB-class and SB-class amplifying devices and the amplifying device according to this embodiment for comparison. Test conditions are that the input signals of four channels of BTL amplifier units are in phase and have the same level, the power supply voltage "VDD" is 14V, the load resistance is 4Ω, and the frequency of the input signal is 1 kHz. The KB-class amplifying device includes a plurality of amplifiers vertically stacked between lines of a single rail and switches the power supply for each output bridge circuit in response to the signal level. The SB-class amplifying device switches between bridge operation and single operation in response to the signal level between lines of a single rail.

As shown in FIG. 26, the conventional high-efficiency KB-class and SB-class amplifying devices have lower power losses than the AB-class (B-class) amplifying device. The power amplifying device according to this embodiment exhibits an even lower power loss than these two conventional high-efficiency amplifying devices.

In the region where Po=1 (W/ch), the AB-class (B-class) amplifying device exhibits a power loss "pD" of 21 W, and the KB-class and SB-class amplifying devices exhibit approximately 8.7 W. According to this embodiment, however, in the region where Po=1(W/ch), the power loss is approximately 3.4 W, and the heat generation is substantially reduced.

Furthermore, according to this embodiment, in the region where Po=1(W/ch), the heat generation is reduced by approximately 60% compared with the KB-class amplifying device.

Furthermore, in the region where Po=5(W/ch), the AB-class (B-class) amplifying device exhibits a power loss "pD" of 36.4 W, and the KB-class and SB-class amplifying devices exhibit approximately 20.1 W. According to this embodiment, however, the power loss is approximately 12 W, and the heat generation is substantially reduced. Thus, according to this embodiment, in the region where Po=5(W/ch), the heat generation is reduced by approximately 40%.

In the high signal region higher than 5 W, the heat generation reducing effect of this embodiment decreases, although the heat generation is still less than conventional amplifying devices.

When the power amplifying device is actually used as an audio amplifier, the average output power "Po" is said to be several watts (W/ch) with respect to the peak amplitude value, so that the TB-class amplifying device is expected to have a low power loss in the actual use region and to substantially reduce heat generation.

As described above, the power amplifying device according to the first embodiment can reduce the consumed current.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A power amplifying device, comprising:
   a first potential line;
   a second potential line;
   a third potential line;
   a first BTL amplifier unit that has a first output amplifier and a second output amplifier that are bridge-connected and outputs a first output signal obtained by amplifying a first input signal;
   a second BTL amplifier unit that has a third output amplifier and a fourth output amplifier that are bridge-connected and outputs a second output signal obtained by amplifying a second input signal;
   a third BTL amplifier unit that has a fifth output amplifier and a sixth output amplifier that are bridge-connected and outputs a third output signal obtained by amplifying a third input signal;
   a fourth BTL amplifier unit that has a seventh output amplifier and an eighth output amplifier that are bridge-connected and outputs a fourth output signal obtained by amplifying a fourth input signal;
   a first connecting circuit that connects the first and second output amplifiers between the second potential line and the third potential line or between the second potential line and the first potential line in response to the first output signal;
   a second connecting circuit that connects the third and fourth output amplifiers between the first potential line and the third potential line or between the first potential line and the second potential line in response to the second output signal;
   a third connecting circuit that connects the fifth and sixth output amplifiers between the second potential line and the third potential line or between the second potential line and the first potential line in response to the third output signal;
   a fourth connecting circuit that connects the seventh and eighth output amplifiers between the first potential line and the third potential line or between the first potential line and the second potential line in response to the fourth output signal;
   a low potential-side switching circuit that is turned on to establish a connection between an output of the second output amplifier and an output of the fifth output amplifier or is turned off to break the connection between the output of the second output amplifier and the output of the fifth output amplifier in response to the first and third input signals;
   a high potential-side switching circuit that is turned on to establish a connection between an output of the fourth output amplifier and an output of the seventh output amplifier or is turned off to break the connection between the output of the fourth output amplifier and the output of the seventh output amplifier in response to the second and fourth input signals;
   a first controlling circuit that controls outputs of the first and second output amplifiers in response to the first input signal;
   a second controlling circuit that controls outputs of the third and fourth output amplifiers in response to the second input signal;
   a third controlling circuit that controls outputs of the fifth and sixth output amplifiers in response to the third input signal; and
   a fourth controlling circuit that controls outputs of the seventh and eighth output amplifiers in response to the fourth input signal.

2. The power amplifying device according to claim 1, wherein
   the first potential line is supplied to a first potential,
   the second potential line is supplied to a second potential that is lower than the first potential, and
   the third potential line is supplied to a third potential that is between the first potential and the second potential.

3. The power amplifying device according to claim 1, wherein the low potential-side switching circuit
   is turned off when an amplitude of at least one of the first input signal and the third input signal is equal to or higher than a first input threshold and
   is turned on when the amplitudes of both the first input signal and the third input signal are lower than the first input threshold, and
   the high potential-side switching circuit
   is turned off when an amplitude of at least one of the second input signal and the fourth input signal is equal to or higher than a second input threshold and
   is turned on when the amplitudes of both the second input signal and the fourth input signal are lower than the second input threshold.

4. The power amplifying device according to claim 2, wherein the low potential-side switching circuit
   is turned off when an amplitude of at least one of the first input signal and the third input signal is equal to or higher than a first input threshold and
   is turned on when the amplitudes of both the first input signal and the third input signal are lower than the first input threshold, and
   the high potential-side switching circuit
   is turned off when an amplitude of at least one of the second input signal and the fourth input signal is equal to or higher than a second input threshold and
   is turned on when the amplitudes of both the second input signal and the fourth input signal are lower than the second input threshold.

5. The power amplifying device according to claim 3, wherein the first input threshold is set so that the amplitudes of the first and third output signals are equal to or lower than a fourth of a potential difference between the first potential and the second potential when the amplitudes of the first and third input signals are lower than the first input threshold, and
   the second input threshold is set so that the amplitudes of the second and fourth output signals are equal to or lower than a fourth of the potential difference between the first potential and the second potential when the amplitudes of the second and fourth input signals are lower than the second input threshold.

6. The power amplifying device according to claim 3, further comprising:
   a first comparator that outputs a signal that turns off the low potential-side switching circuit when the amplitude of at least one of the first input signal and the third input signal is equal to or higher than the first input threshold, and outputs a signal that turns on the low potential-side switching circuit when the amplitudes of both the first input signal and the third input signal are lower than the first input threshold; and
   a second comparator that outputs a signal that turns off the high potential-side switching circuit when the amplitude of at least one of the second input signal and the fourth input signal is equal to or higher than the second input threshold, and outputs a signal that turns on the high potential-side switching circuit when the amplitudes of both the second input signal and the fourth input signal are lower than the second input threshold.

7. The power amplifying device according to claim 2, wherein the first controlling circuit sets the first output signal of the first BTL amplifier unit at a fourth potential that is between the third potential and the second potential when the first input signal is null,
the second controlling circuit sets the second output signal of the second BTL amplifier unit at a fifth potential that is between the first potential and the third potential when the second input signal is null,
the third controlling circuit sets the third output signal of the third BTL amplifier unit at the fourth potential when the third input signal is null, and
the fourth controlling circuit sets the fourth output signal of the fourth BTL amplifier unit at the fifth potential when the fourth input signal is null.

8. The power amplifying device according to claim 1, wherein each of the first and second output amplifiers has a current supply terminal to which a current is supplied, a current sweep-out terminal from which a current is swept out, and an output terminal from which a signal is output, and
the first connecting circuit
connects the current supply terminals of the first and second output amplifiers to the first potential line and the current sweep-out terminals of the first and second output amplifiers to the second potential line, or connects the current supply terminals of the first and second output amplifiers to the third potential line and the current sweep-out terminals of the first and second output amplifiers to the second potential line in response to the first output signal.

9. The power amplifying device according to claim 4, wherein the first connecting circuit connects the first and second output amplifiers between the second potential line and the third potential line when an amplitude of the first output signal is lower than a first output threshold, and connects the first and second output amplifiers between the second potential line and the first potential line when the amplitude of the first output signal is equal to or higher than the first output threshold,
the second connecting circuit connects the third and fourth output amplifiers between the first potential line and the third potential line when an amplitude of the second output signal is lower than a second output threshold, and connects the third and fourth output amplifiers between the first potential line and the second potential line when the amplitude of the second output signal is equal to or higher than the second output threshold,
the third connecting circuit connects the fifth and sixth output amplifiers between the second potential line and the third potential line when an amplitude of the third output signal is lower than the first output threshold, and connects the fifth and sixth output amplifiers between the second potential line and the first potential line when the amplitude of the third output signal is equal to or higher than the first output threshold, and
the fourth connecting circuit connects the seventh and eighth output amplifiers between the first potential line and the third potential line when an amplitude of the fourth output signal is lower than the second output threshold, and connects the seventh and eighth output amplifiers between the first potential line and the second potential line when the amplitude of the third output signal is equal to or higher than the second output threshold.

10. The power amplifying device according to claim 7, wherein first and second output thresholds are equal to or less than a half of the potential difference between the first potential and the second potential.

11. The power amplifying device according to claim 3, wherein the first controlling circuit
controls gains of the first and second output amplifiers so that a differential gain of the first output signal with respect to the first input signal of the first BTL amplifier unit is a prescribed constant value,
the second controlling circuit
controls gains of the third and fourth output amplifiers so that a differential gain of the second output signal with respect to the second input signal of the second BTL amplifier unit is a prescribed constant value,
the third controlling circuit
controls gains of the fifth and sixth output amplifiers so that a differential gain of the third output signal with respect to the third input signal of the third BTL amplifier unit is a constant prescribed value, and
the fourth controlling circuit
controls gains of the seventh and eighth output amplifiers so that a differential gain of the fourth output signal with respect to the fourth input signal of the fourth BTL amplifier unit is a constant prescribed value.

12. The power amplifying device according to claim 9, wherein when the low potential-side switching circuit is in an on state, the first controlling circuit sets the output of the second output amplifier at a first reference potential, and the third controlling circuit sets the output of the fifth output amplifier at the first reference potential, and
when the low potential-side switching circuit is in an off state, the first controlling circuit controls an output of the first output amplifier so that the output potential of the first output amplifier immediately before the low potential-side switching circuit is turned off is maintained, and the third controlling circuit controls an output of the sixth output amplifier so that the output potential of the sixth output amplifier immediately before the low potential-side switching circuit is turned off is maintained.

13. The power amplifying device according to claim 9, wherein when the high potential-side switching circuit is in the on state, the second controlling circuit sets the output of the fourth output amplifier at a second reference potential, and the fourth controlling circuit sets the output of the seventh output amplifier at the second reference potential, and
when the high potential-side switching circuit is in the off state, the second controlling circuit controls an output of the third output amplifier so that the output potential of the third output amplifier immediately before the high potential-side switching circuit is turned off is maintained, and the fourth controlling circuit controls an output of the eighth output amplifier so that the output potential of the eighth output amplifier immediately before the high potential-side switching circuit is turned off is maintained.

14. The power amplifying device according to claim 3, wherein the first controlling circuit includes:
a differential output circuit that receives the first input signal at an input thereof and outputs differential signals based on the first input signal at a first output and a second output thereof;

a first resistor that is connected to the first output of the differential output circuit at a first end thereof and to a first positive-phase input of the first output amplifier and a first reverse-phase input of the second output amplifier at a second end thereof;

a second resistor that is connected to the second output of the differential output circuit at a first end thereof and to a first positive-phase input of the second output amplifier and a first reverse-phase input of the first output amplifier at a second end thereof;

a third resistor that is connected to the second end of the first resistor at a first end thereof and to an output terminal of the second output amplifier at a second end thereof;

a fourth resistor that is connected to the second end of the second resistor at a first end thereof and to an output terminal of the first output amplifier at a second end thereof;

a fifth resistor that is connected to the output of the first output amplifier at a first end thereof and to a second reverse-phase input of the first output amplifier and a second reverse-phase input of the second output amplifier at a second end thereof;

a first controlling switch that is connected to the second end of the fifth resistor at a first end of a current path thereof and to a second positive-phase input of the first output amplifier and a second positive-phase input of the second output amplifier at a second end of the current path and is turned on or off in synchronization with the low potential-side switching circuit;

a capacitor that receives a reference voltage at a first end and is connected to the second end of the current path of the first controlling switch at a second end thereof;

a sixth resistor that is connected to the output of the second output amplifier at a first end thereof and to a third reverse-phase input of the first output amplifier and a third reverse-phase input of the second output amplifier at a second end thereof;

a second controlling switch that is connected to the second end of the sixth resistor at a first end of a current path thereof and to a third positive-phase input of the first output amplifier and a third positive-phase input of the second output amplifier at a second end of the current path and is turned on or off complementarily to the first controlling switch; and a seventh resistor that receives the reference voltage at a first end thereof and is connected to the second end of the current path of the second controlling switch at a second end thereof, wherein the first output amplifier outputs, at the output terminal, a signal responsive to a potential difference between the first positive-phase input and the first reverse-phase input, a potential difference between the second positive-phase input and the second reverse-phase input and a potential difference between the third positive-phase input and the third reverse-phase input of the first output amplifier, and the second output amplifier outputs, at the output terminal, a signal responsive to a potential difference between the first positive-phase input and the first reverse-phase input, a potential difference between the second positive-phase input and the second reverse-phase input and a potential difference between the third positive-phase input and the third reverse-phase input of the second output amplifier.

15. The power amplifying device according to claim 12, wherein the first output amplifier includes:

a first MOS transistor that is connected to a current supply terminal at a first end of a current path thereof and to the output terminal at a second end of the current path; and a second MOS transistor that is connected to the output terminal at a first end of a current path thereof and to a current sweep-out terminal at a second end of the current path, and the first MOS transistor and the second MOS transistor are complementarily turned on or off in response to a potential difference between a first positive-phase input and a first reverse-phase input, a potential difference between a second positive-phase input and a second reverse-phase input and a potential difference between a third positive-phase input and a third reverse-phase input of the first output amplifier.

16. The power amplifying device according to claim 2, wherein the third potential is at the midpoint between the first potential and the second potential.

* * * * *